(12) United States Patent
Kijima et al.

(10) Patent No.: US 7,303,828 B2
(45) Date of Patent: Dec. 4, 2007

(54) FERROELECTRIC FILM, METHOD OF MANUFACTURING THE SAME, FERROELECTRIC MEMORY AND PIEZOELECTRIC DEVICE

(75) Inventors: Takeshi Kijima, Matsumoto (JP); Hiromu Miyazawa, Toyoshina-machi (JP); Yasuaki Hamada, Suwa (JP); Eiji Natori, Chino (JP)

(73) Assignee: Seiko Epson Corporation, Tokyo (JP)

( * ) Notice: Subject to any disclaimer, the term of this patent is extended or adjusted under 35 U.S.C. 154(b) by 388 days.

(21) Appl. No.: 10/807,427

(22) Filed: Mar. 24, 2004

(65) Prior Publication Data
US 2004/0241501 A1 Dec. 2, 2004

(30) Foreign Application Priority Data
Mar. 28, 2003 (JP) ............................. 2003-091523
Aug. 27, 2003 (JP) ............................. 2003-209116
Jan. 13, 2004 (JP) ............................. 2004-005297

(51) Int. Cl.
*B32B 9/00* (2006.01)

(52) U.S. Cl. .................... 428/701; 428/702; 428/450
(58) Field of Classification Search .................... None
See application file for complete search history.

(56) References Cited

U.S. PATENT DOCUMENTS 5,378,382 A * 1/1995 Nishimura et al. ... 252/62.9 PZ

FOREIGN PATENT DOCUMENTS

EP 1 039 525 A1 * 9/2000

OTHER PUBLICATIONS

U.S. Appl. No. 10/807,357, filed Mar. 24, 2004, Hamada et al.

* cited by examiner

*Primary Examiner*—Jennifer C. McNeil
*Assistant Examiner*—Timothy M. Speer
(74) *Attorney, Agent, or Firm*—Oliff & Berridge, PLC

(57) ABSTRACT

A ferroelectric film wherein 5 to 40 mol % in total of at least one of Nb, V, and W is included in the B site of a $Pb(Zr,Ti)O_3$ ferroelectric which includes at least four-fold coordinated $Si^{4+}$ or $Ge^{4+}$ in the A site ion of a ferroelectric perovskite material in an amount of 1% or more. This enables to significantly improve reliability of the ferroelectric film.

19 Claims, 21 Drawing Sheets

$SiTiO_3$

A site : Si
B site : Ti $PbSiO_3$

A site : Pb
B site : Si

FERROELECTRIC FILM, METHOD OF MANUFACTURING THE SAME, FERROELECTRIC MEMORY AND PIEZOELECTRIC DEVICE

Japanese Patent Application No. 2003-91523, filed on Mar. 28, 2003, Japanese Patent Application No. 2003-209116, filed on Aug. 27, 2003, and Japanese Patent Application No. 2004-5297, filed on Jan. 13, 2004 are hereby incorporated by reference in their entirety.

BACKGROUND OF THE INVENTION

The present invention relates to a ferroelectric memory and a piezoelectric device formed by using a ferroelectric capacitor. The present invention also relates to a ferroelectric film which can be used in common for 1T1C and 2T2C type ferroelectric memory devices which include a ferroelectric capacitor and a select cell transistor, a simple matrix type ferroelectric memory device in which a memory cell is formed by using only a ferroelectric capacitor without a cell transistor, and a 1T type ferroelectric memory device in which a ferroelectric film is used as a gate oxide film, a method of manufacturing the ferroelectric film, a ferroelectric memory, and a piezoelectric device.

In recent years, research and development of a film such as PZT or SBT, a ferroelectric capacitor using the film, and a ferroelectric memory device have been extensively conducted. The structure of a ferroelectric memory device is roughly divided into 1T, 1T1C, 2T2C, and simple matrix. Since the 1T type ferroelectric memory device has a structure in which retention (data retention) is as short as one month due to occurrence of an internal electric field in the capacitor, it is impossible to secure a 10-year guarantee generally required for semiconductors. The 1T1C and 2T2C type ferroelectric memory devices have almost the same configuration as that of a DRAM, and include a select transistor. Therefore, a DRAM manufacturing technology can be utilized and a write speed approximately equal to the write speed of an SRAM can be realized. Therefore, small capacity products with a capacity of 256 kbits or less have been produced on a commercial basis.

As a ferroelectric material used for a ferroelectric memory, a perovskite material such as $Pb(Zr,Ti)O_3$ (PZT) and a Bi-layered-structured ferroelectric such as $Bi_4Ti_3O_{12}$ (BIT) have been used. However, since these materials have a leakage current density of about $10^{-4}$ to $10^{-6}$ A/cm$^2$, an extremely large current leakage occurs.

PZT is used as a typical ferroelectric material. A material having a composition in or near the mixed region of the rhombohedral crystal and the tetragonal crystal, in which the Zr/Ti ratio is 52/48 or 40/60, is used as PZT. PZT is used after doping with an element such as La, Sr, or Ca. The above region is used to secure reliability, which is the most important requirement for the memory device. Although the hysteresis shape is excellent in the Ti-rich tetragonal region, a Schottky defect occurs due to the ionic crystal structure, whereby a failure in leakage current characteristics or imprint characteristics (degree of change in hysteresis shape) occurs. This makes it difficult to secure reliability.

In recent years, it is known that the crystallization temperature is reduced by adding Si and Ge to the constituent elements of the ferroelectric crystal in order to solve the above-described problems. However, it is not known which site Si and Ge replace in the crystal. This is an important subject in the functional design of the ferroelectric material in the case of introducing an element other than Si and Ge.

The simple matrix type ferroelectric memory device has a cell size smaller than that of the 1T1C and 2T2C type ferroelectric memory devices, and allows the capacitors to be multilayered. Therefore, an increase in the degree of integration and a reduction of cost are expected by using the simple matrix type ferroelectric memory device. A conventional simple matrix type ferroelectric memory device is disclosed in Japanese Patent Application Laid-open No. 9-116107, for example. Japanese Patent Application Laid-open No. 9-116107 discloses a drive method in which a voltage of one-third the write voltage is applied to unselected memory cells when writing data into the memory cell.

However, this technology does not describe the hysteresis loop of the ferroelectric capacitor necessary for the operation in detail. The present inventors have developed a ferroelectric memory device and found that a hysteresis loop with excellent squareness is indispensable for obtaining a simple matrix type ferroelectric memory device which can be operated in practice. As a ferroelectric material which can deal with such a requirement, Ti-rich tetragonal PZT may be employed. However, the most important subject is to secure reliability in the same manner as the above-described 1T1C and 2T2C type ferroelectric memories.

BRIEF SUMMARY OF THE INVENTION

The present invention may provide a ferroelectric film which can be applied to a ferroelectric capacitor having hysteresis characteristics capable of being used for 1T1C, 2T2C, and simple matrix type ferroelectric memories, and a method of manufacturing such a ferroelectric film. The present invention may further provide 1T1C, 2T2C, and simple matrix type ferroelectric memories using the above ferroelectric film, and a piezoelectric device.

According to one aspect of the present invention, there is provided a ferroelectric film including a perovskite ferroelectric or a bismuth layer-structured ferroelectric shown by $ABO_3$ or $(Bi_2O_2)^{2+}(A_{m-1}B_mO_{3m+1})^{2-}$ (wherein A represents at least one ion selected from the group consisting of Li$^+$, Na$^+$, K$^+$, Pb$^{2+}$, Ca$^{2+}$, Sr$^{2+}$, Ba$^{2+}$, Bi$^{3+}$ and La$^{3+}$, B represents at least one ion selected from the group consisting of Fe$^{3+}$, Ti$^{4+}$, Zr$^{4+}$, Nb$^{5+}$, Ta$^{5+}$, W$^{6+}$ and Mo$^{6+}$, and m is a natural number), wherein at least four-fold coordinated Si$^{4+}$ or Ge$^{4+}$ is included in the A site ion.

Figure 1:
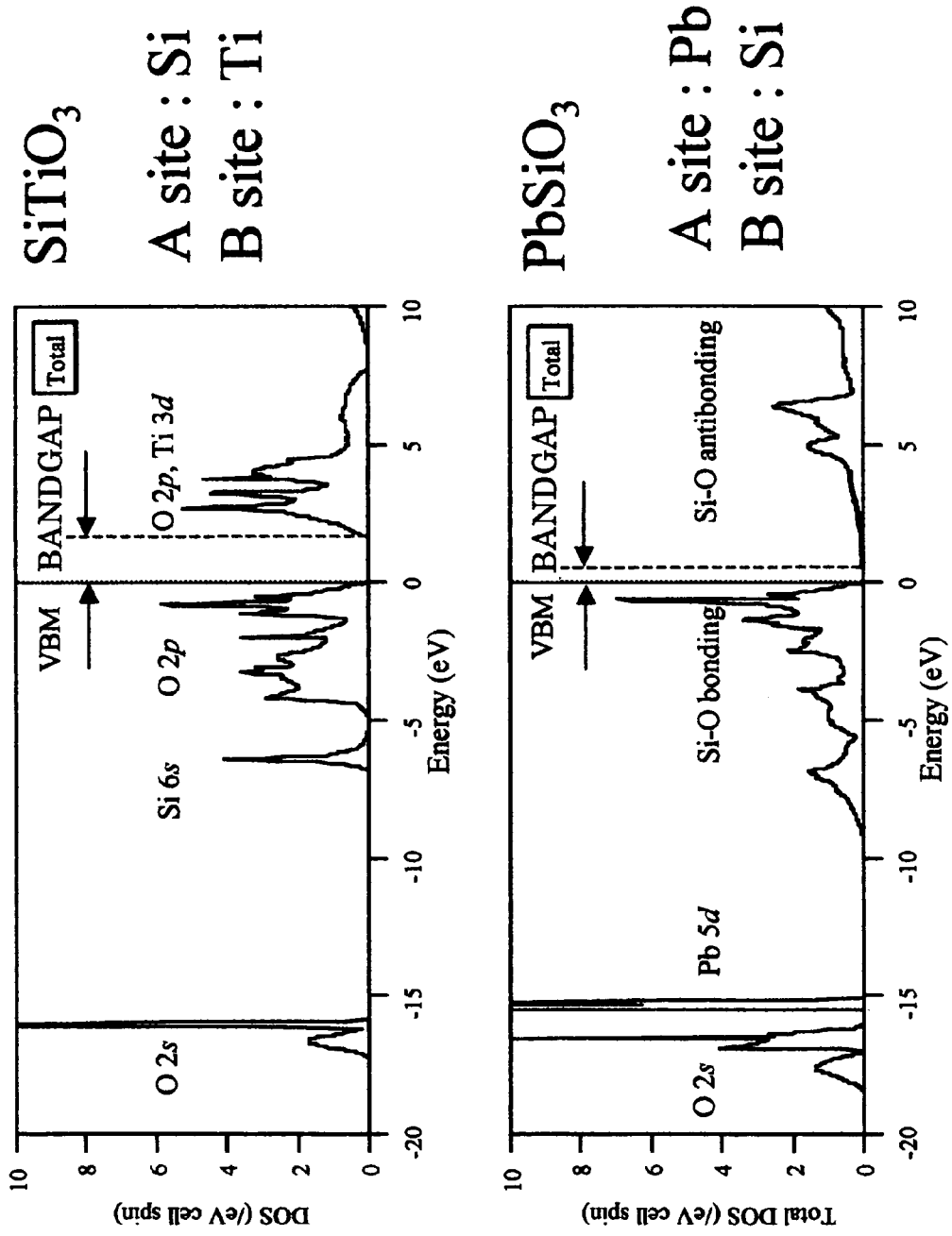
FIG. 1 are graphs showing inverse photoemission spectra determined by first-principles calculation when an $ABO_3$ perovskite structure has Si in the A site (that is SiTiO$_3$) and when an $ABO_3$ perovskite structure has Si in the B site (that is PbSiO$_3$).

DETAILED DESCRIPTION OF THE EMBODIMENTS (1) According to a first embodiment of the present invention, there is provided a ferroelectric film including a perovskite ferroelectric or a bismuth layer-structured ferroelectric shown by $ABO_3$ or $(Bi_2O_2)^{2+}(A_{m-1}B_mO_{3m+1})^{2-}$ (wherein A represents at least one ion selected from the group consisting of $Li^+$, $Na^+$, $K^+$, $Pb^{2+}$, $Ca^{2+}$, $Sr^{2+}$, $Ba^{2+}$, $Bi^{3+}$ and $La^{3+}$, B represents at least one ion selected from the group consisting of $Fe^{3+}$, $Ti^{4+}$, $Zr^{4+}$, $Nb^{5+}$, $Ta^{5+}$, $W^{6+}$ and $Mo^{6+}$, and m is a natural number), wherein at least four-fold coordinated $Si^{4+}$ or $Ge^{4+}$ is included in the A site ion.

(2) According to a second embodiment of the present invention, there is provided a ferroelectric film including a perovskite ferroelectric or a bismuth layer-structured ferroelectric shown by $ABO_3$ or $(Bi_2O_2)^{2+}(A_{m-1}B_mO_{3m+1})^{2-}$ (wherein A represents at least one ion selected from the group consisting of $Li^+$, $Na^+$, $K^+$, $Pb^{2+}$, $Ca^{2+}$, $Sr^{2+}$, $Ba^{2+}$, $Bi^{3+}$ and $La^{3+}$, B represents at least one ion selected from the group consisting of $Fe^{3+}$, $Ti^{4+}$, $Zr^{4+}$, $Nb^{5+}$, $Ta^{5+}$, $W^{6+}$ and $Mo^{6+}$, and m is a natural number), wherein at least four-fold coordinated $Si^{4+}$ or $Ge^{4+}$ is included in the A site ion; and wherein the ferroelectric film is a solid solution with a dielectric shown by $X_2SiO_5$, $X_4Si_3O_{12}$, $X_2GeO_5$ or $X_4Ge_3O_{12}$ (wherein X represents $Bi^{3+}$, $Fe^{3+}$, $Sc^{3+}$, $Y^{3+}$, $La^{3+}$, $Ce^{4+}$, $Pr^{3+}$, $Nd^{3+}$, $Pm^{3+}$, $Sm^{3+}$, $Eu^{3+}$, $Gd^{3+}$, $Tb^{3+}$, $Dy^{3+}$, $Ho^{3+}$, $Er^{3+}$, $TM^{3+}$, $Yb^{3+}$ or $Lu^{3+}$).

(3) According to a third embodiment of the present invention, there is provided a ferroelectric film including a perovskite ferroelectric or a bismuth layer-structured ferroelectric shown by $ABO_3$ or $(Bi_2O_2)^{2+}(A_{m-1}B_mO_{3m+1})^{2-}$ (wherein A represents at least one ion selected from the group consisting of $Li^+$, $Na^+$, $K^+$, $Pb^{2+}$, $Ca^{2+}$, $Sr^{2+}$, $Ba^{2+}$, $Bi^{3+}$ and $La^{3+}$, B represents at least one ion selected from the group consisting of $Fe^{3+}$, $Ti^{4+}$, $Zr^{4+}$, $Nb^{5+}$, $Ta^{5+}$, $W^{6+}$ and $Mo^{6+}$, and m is a natural number), wherein at least four-fold coordinated $Si^{4+}$ or $Ge^{4+}$ is included in the A site ion; and wherein the ferroelectric film includes at least one transition element in an amount of 5 to 40 mol % in total, the transition element having the maximum positive valence which is +1 or more greater than the valence of the A site ion of the $ABO_3$ or $(Bi_2O_2)^{2+}(A_{m-1}B_mO_{3m+1})^{2-}$.

(4) According to a fourth embodiment of the present invention, there is provided a ferroelectric film including a perovskite ferroelectric or a bismuth layer-structured ferroelectric shown by $ABO_3$ or $(Bi_2O_2)^{2+}(A_{m-1}B_mO_{3m+1})^{2-}$ (wherein A represents at least one ion selected from the group consisting of $Li^+$, $Na^+$, $K^+$, $Pb^{2+}$, $Ca^2$, $Sr^{2+}$, $Ba^{2+}$, $Bi^{3+}$ and $La^{3+}$, B represents at least one ion selected from the group consisting of $Fe^{3+}$, $Ti^{4+}$, $Zr^{4+}$, $Nb^{5+}$, $Ta^{5+}$, $W^{6+}$ and $Mo^{6+}$, and m is a natural number), wherein at least four-fold coordinated $Si^{4+}$ or $Ge^{4+}$ is included in the A site ion; and wherein the ferroelectric film includes at least one transition element in an amount of 5 to 40 mol % in total, the transition element having the maximum positive valence which is +1 or more greater than the valence of the B site ion of the $ABO_3$ or $(Bi_2O_2)^{2+}(A^{m-1}B_mO_{3m+1})^{2-}$.

(5) According to a fifth embodiment of the present invention, there is provided a ferroelectric film including a perovskite ferroelectric or a bismuth layer-structured ferroelectric shown by $ABO_3$ or $(Bi_2O_2)^{2+}(A_{m-1}B_mO_{3m+1})^{2-}$ (wherein A represents at least one ion selected from the group consisting of $Li^+$, $Na^+$, $K^+$, $Pb^{2+}$, $Ca^{2+}$, $Sr^{2+}$, $Ba^{2+}$, $Bi^{3+}$ and $La^{3+}$, B represents at least one ion selected from the group consisting of $Fe^{3+}$, $Ti^{4+}$, $Zr^{4+}$, $Nb^{5+}$, $Ta^{5+}$, $W^{6+}$ and $Mo^{6+}$, and m is a natural number), wherein at least four-fold coordinated $Si^{4+}$ or $Ge^{4+}$ is included in the A site ion;

wherein the ferroelectric film includes at least one transition element having the maximum positive valence which is +1 or more greater than the valence of the B site ion of the $ABO_3$ or $(Bi_2O_2)^{2+}(A_{m-1}B_mO_{3m+1})^{2-}$;

wherein the ferroelectric film includes at least one transition element having the maximum positive valence which is +1 or more greater than the valence of the A site ion of the $ABO_3$ or $(Bi_2O_2)^{2+}(A_{m-1}B_mO_{3m+1})^{2-}$; and wherein the transition elements are included in an amount of 5 to 40 mol % in the A and B sites in total.

(6) According to a sixth embodiment of the present invention, there is provided a ferroelectric film including a perovskite ferroelectric or a bismuth layer-structured ferroelectric shown by $ABO_3$ or $(Bi_2O_2)^{2+}(A_{m-1}B_mO_{3m+1})^{2-}$ (wherein A represents at least one ion selected from the group consisting of $Li^+$, $Na^+$, $K^+$, $Pb^{2+}$, $Ca^{2+}$, $Sr^{2+}$, $Ba^{2+}$, $Bi^{3+}$ and $La^{3+}$, B represents at least one ion selected from the group consisting of $Fe^{3+}$, $Ti^{4+}$, $Zr^{4+}$, $Nb^{5+}$, $Ta^{5+}$, $W^{6+}$ and $Mo^{6+}$, and m is a natural number), wherein at least four-fold coordinated $Si^{4+}$ or $Ge^{4+}$ is included in the A site ion;

wherein the ferroelectric film is a solid solution with a dielectric shown by $X_2SiO_5$, $X_4Si_3O_{12}$, $X_2GeO_5$ or $X_4Ge_3O_{12}$ (wherein X represents $Bi^{3+}$, $Fe^{3+}$, $Sc^{3+}$, $Y^{3+}$, $La^{3+}$, $Ce^{3+}$, $Pr^{3+}$, $Nd^{3+}$, $Pm^{3+}$, $Sm^{3+}$, $Eu^{3+}$, $Gd^{3+}$, $Tb^{3+}$, $Dy^{3+}$, $Ho^{3+}$, $Er^{3+}$, $Tm^{3+}$, $Yb^{3+}$ or $Lu^{3+}$); and wherein the ferroelectric film includes at least one transition element in an amount of 5 to 40 mol % in total, the transition element having the maximum positive valence which is +1 or more greater than the valence of the A site ion of the $ABO_3$ or $(Bi_2O_2)^{2+}(A_{m-1}B_mO_{3m+1})^{2-}$.

(7) According to a seventh embodiment of the present invention, there is provided a ferroelectric film including a perovskite ferroelectric or a bismuth layer-structured ferroelectric shown by $ABO_3$ or $(Bi_2O_2)^{2+}(A_{m-1}B_mO_{3m+1})^{2-}$ (wherein A represents at least one ion selected from the group consisting of $Li^+$, $Na^+$, $K^+$, $Pb^{2+}$, $Ca^{2+}$, $Sr^{2+}$, $Ba^{2+}$, $Bi^{3+}$ and $^{3+}$, B represents at least one ion selected from the group consisting of $Fe^{3+}$, $Ti^{4+}$, $Zr^{4+}$, $Nb^{5+}$, $Ta^{5+}$, $W^{6+}$ and $Mo^{6+}$, and m is a natural number), wherein at least four-fold coordinated $Si^{4+}$ or $Ge^{4+}$ is included in the A site ion;

wherein the ferroelectric film is a solid solution with a dielectric shown by $X_2SiO_5$, $X_4Si_3O_{12}$, $X_2GeO_5$ or $X_4Ge_3O_{12}$ (wherein X represents $Bi^{3+}$, $Fe^{3+}$, $Sc^{3+}$, $Y^{3+}$, $La^{3+}$, $Ce^{3+}$, $Pr^{3+}$, $Nd^{3+}$, $Pm^{3+}$, $Sm^{3+}$, $Eu^{3+}$, $Gd^{3+}$, $Tb^{3+}$, $Dy^{3+}$, $Ho^{3+}$, $Er^{3+}$, $Tm^{3+}$, $Yb^{3+}$ or $Lu^{3+}$); and wherein the ferroelectric film includes at least one transition element in an amount of 5 to 40 mol % in total, the transition element having the maximum positive valence which is +1 or more greater than the valence of the B site ion of the $ABO_3$ or $(Bi_2O_2)^{2+}(A_{m-1}B_mO_{3m+1})^{2-}$.

(8) According to an eighth embodiment of the present invention, there is provided a ferroelectric film including a perovskite ferroelectric or a bismuth layer-structured ferroelectric shown by $ABO_3$ or $(Bi_2O_2)^{2+}(A_{m-1}B_mO_{3m+1})^{2-}$ (wherein A represents at least one ion selected from the group consisting of $Li^+$, $Na^+$, $K^+$, $Pb^{2+}$, $Ca^{2+}$, $Sr^{2+}$, $Ba^{2+}$, $Bi^+$ and $La^{3+}$, B represents at least one ion selected from the group consisting of $Fe^{3+}$, $Ti^{4+}$, $Zr^{4+}$, $Nb^{5+}$, $Ta^{5+}$, $W^{6+}$ and $Mo^{6+}$, and m is a natural number), wherein at least four-fold coordinated $Si^{4+}$ or $Ge^{4+}$ is included in the A site ion;

wherein the ferroelectric film is a solid solution with a dielectric shown by $X_2SiO_5$, $X_4Si_3O_{12}$, $X_2GeO_5$ or $X_4Ge_3O_{12}$ (wherein X represents $Bi^{3+}$, $Fe^{3+}$, $Sc^{3+}$, $Y^{3+}$, $La^{3+}$, $Ce^{3+}$, $Pr^{3+}$, $Nd^{3+}$, $Pm^{3+}$, $Sm^{3+}$, $Eu^{3+}$, $Gd^{3+}$, $Tb^{3+}$, $Dy^{3+}$, $Ho^{3+}$, $Er^{3+}$, $Tm^{3+}$, $Yb^{3+}$ or $Lu^{3+}$);

wherein the ferroelectric film includes at least one transition element having the maximum positive valence which is +1 or more greater than the valence of the B site ion of the $ABO_3$ or $(Bi_2O_2)^{2+}(A_{m-1}B_mO_{3m+1})^{2-}$;

wherein the ferroelectric film includes at least one transition element having the maximum positive valence which is +1 or more greater than the valence of the A site ion of the $ABO_3$ or $(Bi_2O_2)^{2+}(A_{m-1}B_mO_{3m+1})^{2-}$; and wherein the transition elements are included in an amount of 5 to 40 mol % in the A and B sites in total.

(9) Any of the above ferroelectric films may include $Pb(Zr, Ti)O_3$ which includes at least four-fold coordinated $Si^{4+}$ or $Ge^{4+}$ in the A site ion in an amount of 1% or more; and at least one transition element having the maximum positive valence of +3 or more may be included in the A site in an amount of 5 to 40 mol % in total.

(10) Any of the above ferroelectric films may include $Pb(Zr, Ti)O_3$ which includes at least four-fold coordinated $Si^{4+}$ or $Ge^{4+}$ in the A site ion in an amount of 1% or more; and at least one transition element having the maximum positive valence of +5 or more may be included in the B site in an amount of 5 to 40 mol % in total.

(11) According to a ninth aspect of the present invention, there is provided a ferroelectric film including $Pb(Zr, Ti)O_3$ which includes at least four-fold coordinated $Si^{4+}$ or $Ge^{4+}$ in the Pb site ion in an amount of 1% or more, wherein at least one transition element having the maximum positive valence of +3 or more is included in the Pb site;

wherein at least one transition element having the maximum positive valence of +5 or more is included in the Zr or Ti site; and wherein the transition elements are included in an mount of 5 to 40 mol % in the Pb and Zr or Ti sites in total.

(12) According to a tenth embodiment of the present invention, there is provided a ferroelectric film including $Pb(Zr, Ti)O_3$ which includes at least four-fold coordinated $Si^{4+}$ or $Ge^{4+}$ in the Pb site ion in an amount of 1% or more, wherein at least one of La and other lanthanoid series ions is included in the Pb site in an amount of 5 to 40 mol % in total.

(13) According to an eleventh aspect of the present invention, there is provided a ferroelectric film including $Pb(Zr, Ti)O_3$ which includes at least four-fold coordinated $Si^{4+}$ or $Ge^{4+}$ in the Pb site ion in an amount of 1% or more, wherein at least one of Nb, V and W is included in the Zr or Ti site in an amount of 5 to 40 mol % in total.

(14) According to a twelfth embodiment of the present invention, there is provided a ferroelectric film including $Pb(Zr, Ti)O_3$ which includes at least four-fold coordinated $Si^{4+}$ or $Ge^{4+}$ in the Pb site ion in an amount of 1% or more, wherein at least one of La and other lanthanoid series ions is included in the Pb site, and at least one of Nb, V and W is included in the Zr or Ti site, in an amount of 5 to 40 mol % in the Pb and Zr or Ti sites in total.

(15) Any of the above ferroelectric films may further include at least one of Nb, V and W in the Zr or Ti site in an amount twice the amount of Pb ion vacancy in the Pb site.

(16) Any of the above ferroelectric films may be included (111)-oriented tetragonal crystals.

(17) Any of the above ferroelectric film may be included (001)-oriented rhombohedral crystals.

(18) According to a thirteenth embodiment of the present invention, there is provided a method of manufacturing a ferroelectric films including $Pb(Zr,Ti)O_3$, the method comprising:

using a sol-gel solution for forming $Pb(Zr,Ti)O_3$ which includes at least four-fold coordinated $Si^{4+}$ or $Ge^{4+}$ in the Pb site ion in an amount of 1% or more.

(19) According to a fourteenth embodiment of the present invention, there is provided a method of manufacturing a ferroelectric films including $Pb(Zr,Ti)O_3$, the method comprising:

using a sol-gel solution for forming $Pb(Zr,Ti)O_3$ which includes at least four-fold coordinated $Si^{4+}$ or $Ge^{4+}$ in the Pb site ion in an amount of 1% or more, wherein a mixed solution prepared by mixing a sol-gel solution for forming $PbZrO_3$ which includes at least four-fold coordinated $Si^{4+}$ or $Ge^{4+}$ in the Pb site ion in an amount of 1% or more with a sol-gel solution for forming $PbTiO_3$ which includes at least four-fold coordinated $Si^{4+}$ or $Ge^{4+}$ in the Pb site ion in an amount of 1% or more is used as the sol-gel solution for forming $Pb(Zr,Ti)O_3$.

(20) According to a fifteenth embodiment of the present invention, there is provided a method of manufacturing a ferroelectric films including $Pb(Zr,Ti)O_3$, the method comprising:

using a sol-gel solution for forming Pb(Zr,Ti)O$_3$ in which the amount of Pb ranges from 90 to 120% of the stoichiometric composition of Pb(Zr,Ti)O$_3$.

(21) Any of the above ferroelectric films may include Bi$_4$Ti$_3$O$_{12}$ including at least four-fold coordinated Si$^{4+}$ or Ge$^{4+}$ in the A site ion in an amount of 1% or more; and at least one transition element having the maximum positive valence of +4 or more may be included in the A site in an amount of 5 to 40 mol % in total.

(22) Any of the above ferroelectric films may include Bi$_4$Ti$_3$O$_{12}$ including at least four-fold coordinated Si$^{4+}$ or Ge$^{4+}$ in the A site ion in an amount of 1% or more; and at least one transition element having the maximum positive valence of +5 or more may be included in the B site in an amount of 5 to 40 mol % in total.

(23) According to a sixteenth embodiment of the present invention, there is provided a ferroelectric film including Bi$_4$Ti$_3$O$_{12}$ which includes at least four-fold coordinated Si$^{4+}$ or Ge$^{4+}$ in the Bi site ion in an amount of 1% or more, wherein at least one transition element having the maximum positive valence of +4 or more is included in the Bi site;

wherein at least one transition element having the maximum positive valence of +5 or more is included in the Ti site; and wherein the transition elements are included in an amount of 5 to 40 mol % in the Bi and Ti sites in total.

(24) According to a seventeenth embodiment of the present invention, there is provided a ferroelectric film including Bi$_4$Ti$_3$O$_{12}$ which includes at least four-fold coordinated Si$^{4+}$ or Ge$^{4+}$ in the Bi site ion in an amount of 1% or more, wherein at least one of Nb, V and W is included in the Ti site in an amount of 5 to 40 mol % in total.

(25) Any of the above ferroelectric films may further include at least one of Nb, V, and W in the Ti site in an amount twice the amount of Bi ion vacancy in the Bi site.

(26) Any of the above ferroelectric films may be included (111), (110), and (117) oriented orthorhombic crystals.

(27) According to an eighteenth embodiment of the present invention, there is provided a method of manufacturing a ferroelectric films including Bi$_4$Ti$_3$O$_{12}$, the method comprising:

using a sol-gel solution for forming Bi$_4$Ti$_3$O$_{12}$ which includes at least four-fold coordinated Si$^{4+}$ or Ge$^{4+}$ in the Bi site ion in an amount of 1% or more.

(28) According to a nineteenth embodiment of the present invention, there is provided a method of manufacturing a ferroelectric films including Bi$_4$Ti$_3$O$_{12}$, the method comprising:

using a mixed solution prepared by mixing a solution prepared by mixing a sol-gel solution for forming Bi$_2$O$_3$ with a sol-gel solution for forming TiO$_2$ at a molar ratio of 2:3 with a sol-gel solution for forming a dielectric shown by X$_2$SiO$_5$, X$_4$Si$_3$O$_{12}$, X$_2$GeO$_5$, or X$_4$Ge$_3$O$_{12}$ (wherein X represents Bi$^{3+}$, Fe$^{3+}$, Sc$^{3+}$, Y$^{3+}$, La$^{3+}$, Ce$^{3+}$, Pr$^{3+}$, Nd$^{3+}$, Pm$^{3+}$, Sm$^{3+}$, Eu$^{3+}$, Gd$^{3+}$, Tb$^{3+}$, Dy$^{3+}$, Ho$^{3+}$, Er$^{3+}$, Tm$^{3+}$, Yb$^{+3}$, or Lu$^{3+}$) so that Si$^{4+}$ or Ge$^{4+}$ is included in an amount of 1 mol % or more.

(29) According to a twentieth embodiment of the present invention, there is provided a method of manufacturing a ferroelectric films including Bi$_4$Ti$_3$O$_{12}$, the method comprising:

using a sol-gel solution for forming Bi$_4$Ti$_3$O$_{12}$ in which an excess amount of Bi ranges from 90 to 120% of the stoichiometric composition of Bi$_4$Ti$_3$O$_{12}$.

(30) According to a twenty-first embodiment of the present invention, there is provided a ferroelectric memory comprising any of the above ferroelectric films.

(31) According to a twenty-second embodiment of the present invention, there is provided a piezoelectric device comprising any of the above ferroelectric films.

The embodiments of the present invention are described below in detail with reference to the drawings.

1. Simulation Result for Site Substitution Effect

In the case of applying a ferroelectric material to a memory, it is known that the B site ion of a ferroelectric material having a perovskite structure or a bismuth layered structure is replaced by Si or Ge in order to reduce the crystallization temperature of the ferroelectric material and improve fatigue characteristics. However, since Si or Ge has a very small ionic radius, Si or Ge can replace the B site under an extremely high-pressure environment at a pressure higher than 50 atmospheres.

FIG. 1 shows inverse photoemission spectra determined by first-principles calculation when an ABO$_3$ perovskite structure has Si in the A site (that is SiTiO$_3$) and when an ABO$_3$ perovskite structure has Si in the B site (that is PbSiO$_3$).

The bandgap of PbSiO$_3$, in which Si is assumed to be in the B site, is reduced in an amount of 1.57 eV (becomes semiconductive) in comparison with SiTiO$_3$ in which Si is in the A site, and becomes leaky. A gently sloped spectrum edge is obtained when Si is in the B site, and a sharp spectrum edge is obtained when Si is in the A site. Specifically, higher insulating properties are obtained when Si is in the A site.

In the case where Si is in the B site, the Si-2p peak appears at a position 18.5 meV shallower than that in the case where Si is in the A site. However, it was found that a further separation observation is difficult and the site of Si cannot be distinguished by using an analytical method such as XPS.

2. Ferroelectric Film

Figure 24:
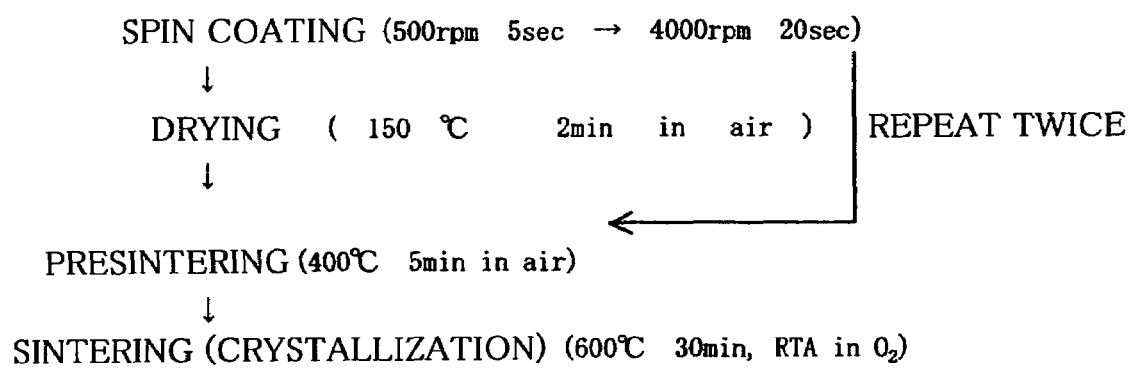
FIG. 24 is a flowchart showing steps of forming a ferroelectric film according to one embodiment of the present invention.

A 100 nm Pt coated Si substrate was used as a substrate. A film with a thickness of 100 nm was formed by using a mixed sol-gel solution prepared by adding a sol-gel solution for forming PbSiO$_3$ to a sol-gel solution containing PbZr$_{0.32}$Ti$_{0.68}$O$_3$ ferroelectric material so that the amount of Si was 10 mol % for one mol of PZT under deposition conditions as shown in FIG. 24. A PbZr$_{0.32}$Ti$_{0.68}$O$_3$ ferroelectric film with a thickness of 100 nm to which PbSiO$_3$ was not added was formed for comparison.

Figure 2:
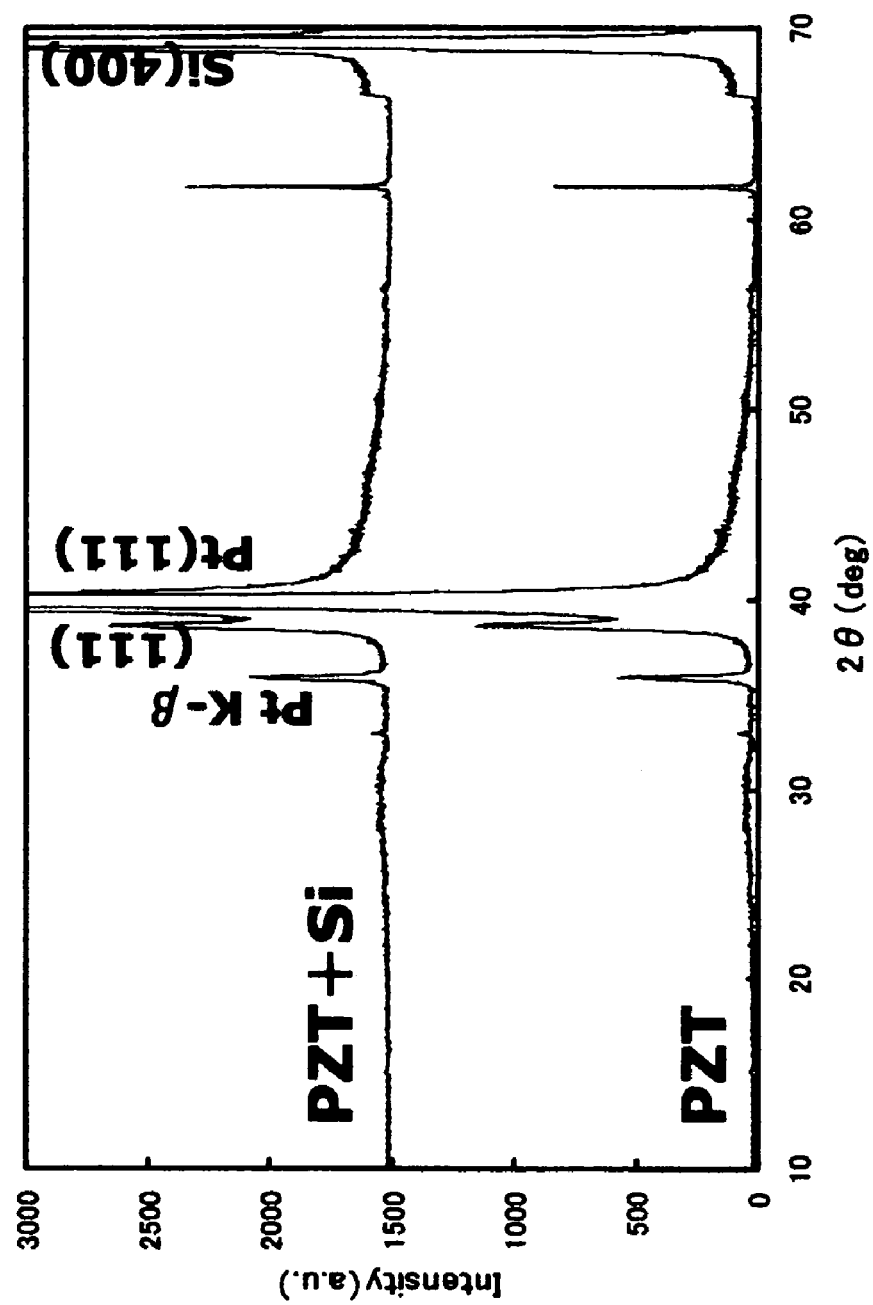
FIG. 2 is a graph showing XRD patterns of PZT and PZT+Si ferroelectric films deposited at 600° C.

FIG. 2 shows XRD patterns obtained by depositing the films at a crystallization temperature of 600° C. as shown in FIG. 24. The PZT and PZT+Si ferroelectric materials of the present embodiment exhibited excellent crystallinity. In the XRD patterns shown in FIG. 2, no change in the (111) peak position was observed.

Figure 3:
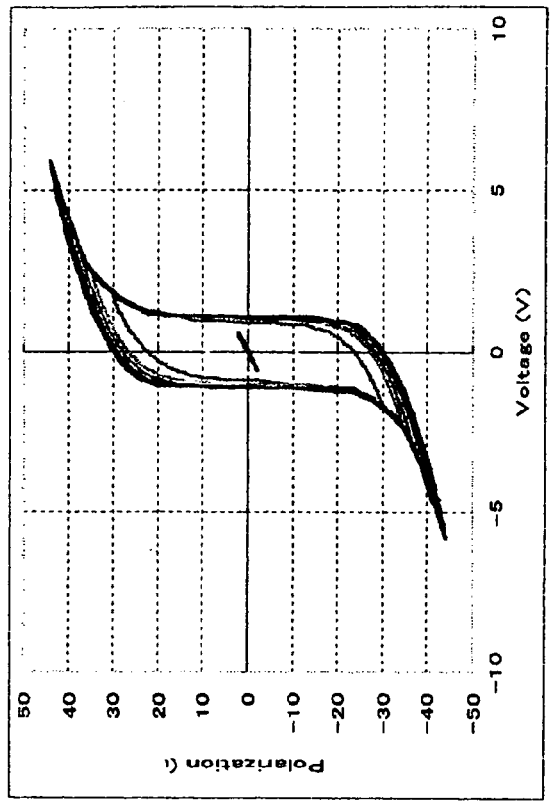
FIG. 3 are graphs showing D-E hysteresis characteristics of PZT and PZT+Si ferroelectric films with a thickness of 100 nm which are deposited at 600° C.
Figure 3:
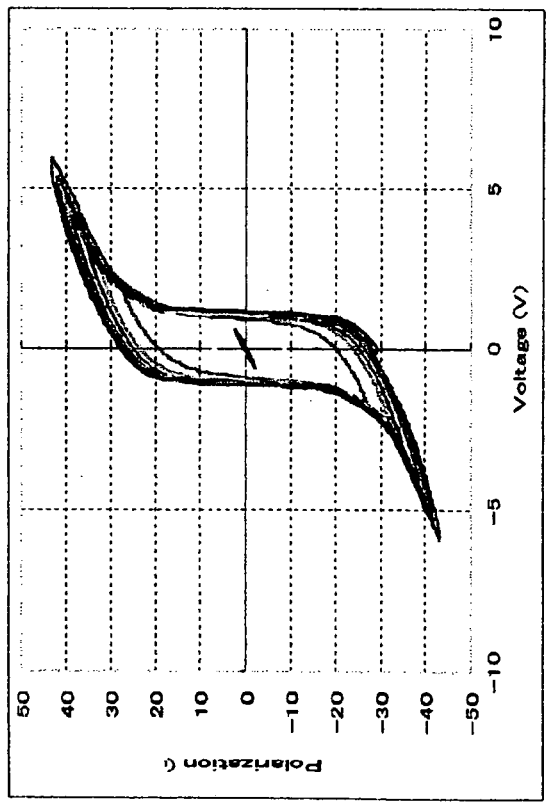

A Pt upper electrode was formed. The ferroelectric characteristics of the PZT and PZT+Si ferroelectric films with a thickness of 100 nm were evaluated using the upper Pt electrode and the lower Pt electrode. As a result, the PZT and PZT+Si films of the present embodiment showed an excellent ferroelectric hysteresis. FIG. 3 shows the D-E hysteresis characteristics. The PZT+Si film of the present embodiment showed hysteresis characteristics similar to the hysteresis characteristics of the PZT film. However, the PZT+Si film of the present embodiment showed better leakage characteristics in comparison with the PZT film.

The fact that the PZT+Si film showed excellent hysteresis characteristics suggests that Si was in the PZT crystal as the constituent element of the crystal. The fact that shift of the XRD peak and a change in characteristics are not observed suggests that Si replaced the A site of PZT. This is because the ferroelectric characteristics would change to a large extent if Si replaced the B site.

Figure 4B:
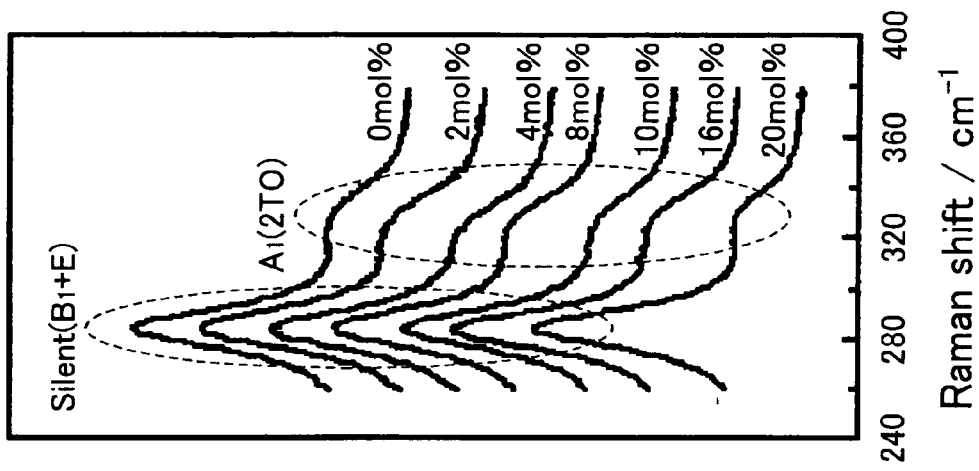
FIGS. 4A and 4B show Raman spectra of a PZT+Si film.
Figure 4A:
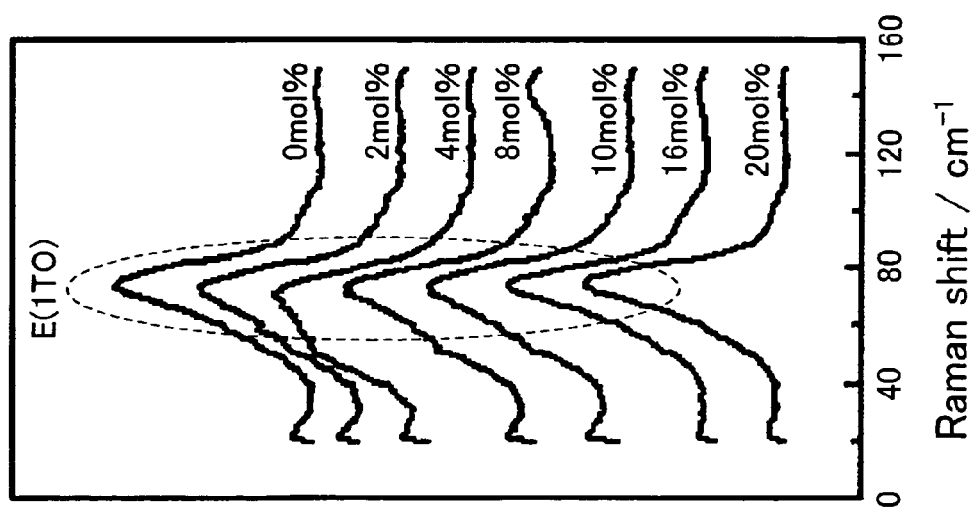

FIGS. 4A and 4B show Raman spectra of the PZT+Si film. FIG. 4A shows a vibrational mode E(1TO) of the A site ion, and FIG. 4B shows a vibrational mode A1(2TO) of the B site ion. As shown in FIG. 4A, changes in the vibrational mode E(1TO) of the A site ion were observed. As shown in FIG. 4B, changes in the vibrational mode A1(2TO) of the B site ion were not observed. Therefore, it was confirmed that Si replaced the A site.

Figure 5:
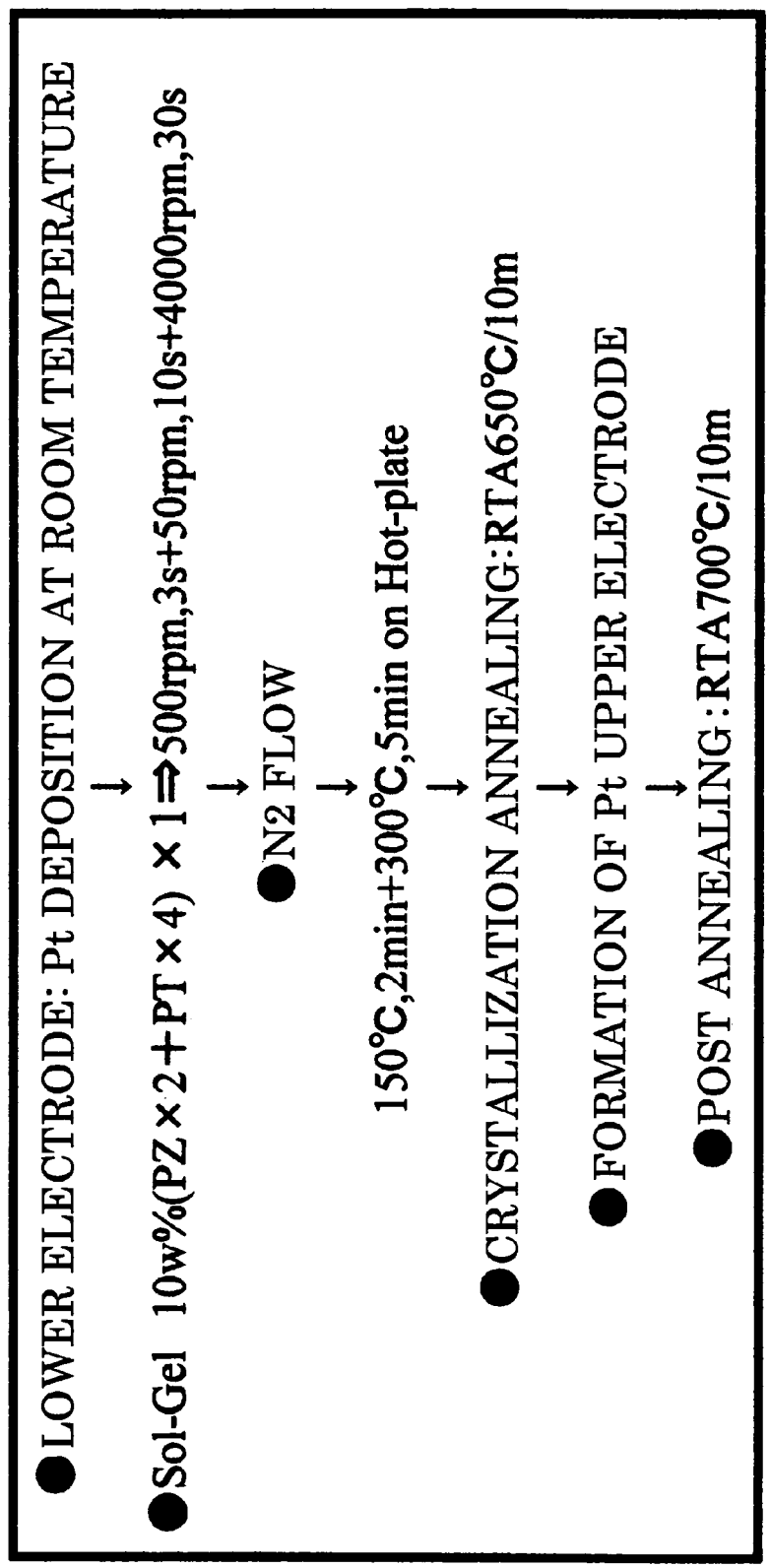
FIG. 5 shows a deposition flow using a sol-gel method.
Figure 6:
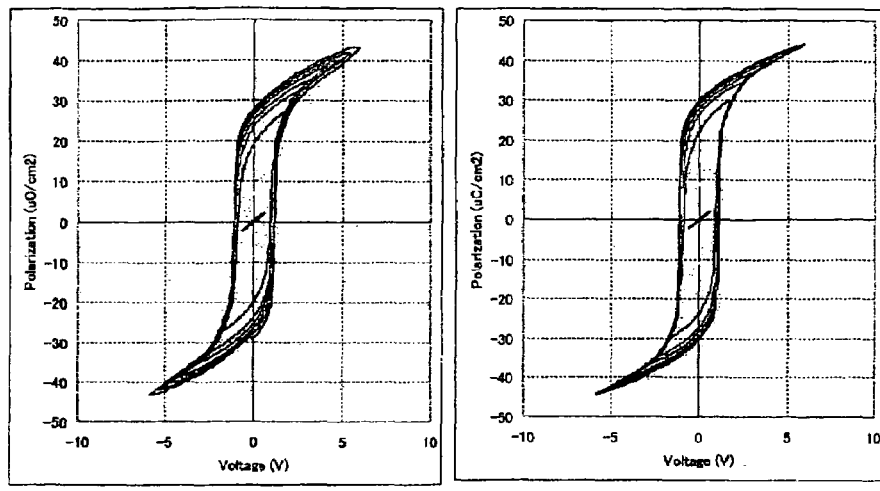
FIG. 6 are graphs showing hysteresis characteristics obtained by using a sol-gel solution for forming a ferroelectric film to which 1 mol % of PbSiO$_3$ silicate and methyl succinate are added while changing the amount pf Nb added to the solution to 0, 5, 10, 20, 30 and 40 mol %.
Figure 6:
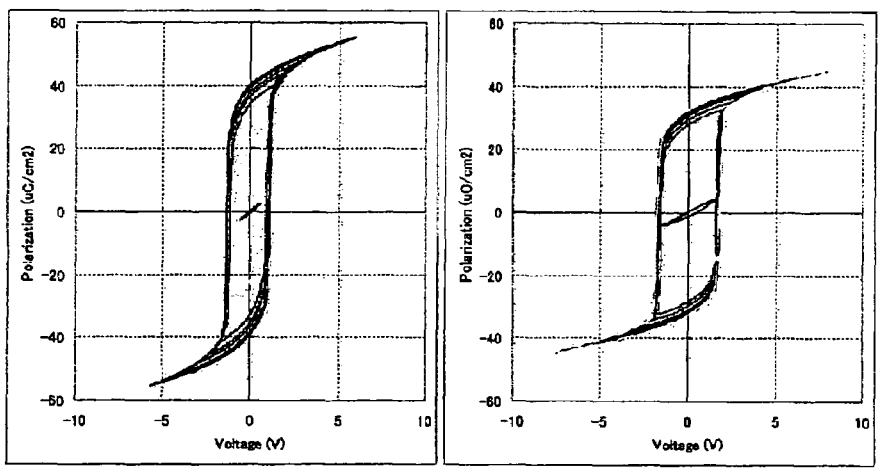
Figure 6:
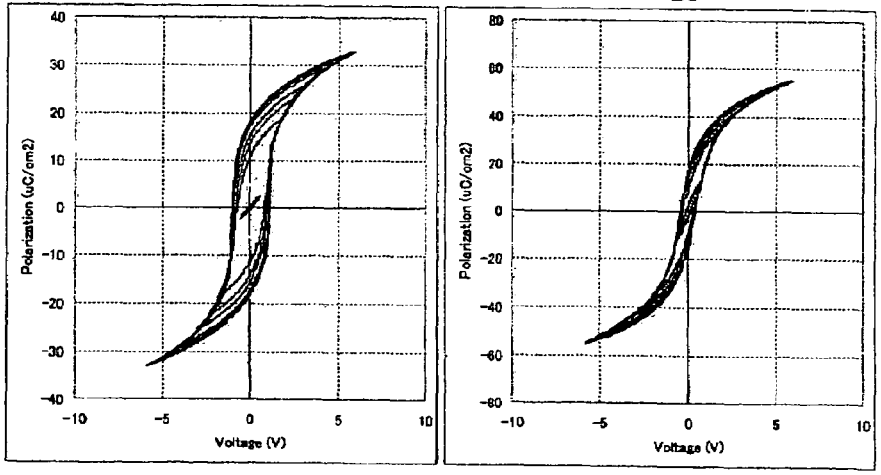

In the present embodiment, ferroelectric characteristics of PZTN were compared while changing the amount of Nb added to 0, 5, 10, 20, 30, and 40 mol %. $PbSiO_3$ silicate was added to all specimens in an amount of 1 mol %. The pH of the sol-gel solution for forming a ferroelectric film was adjusted to 6.0 by adding methyl succinate. A deposition flow shown in FIG. 5 was used. FIG. 6 shows the resulting hysteresis characteristics.

In the case where the amount of Nb added was zero, a leaky hysteresis was obtained. In the case where the amount of Nb added was 5 mol % or more, excellent hysteresis characteristics with high insulating properties were obtained. In the case where the amount of Nb added was 10 mol % or less, a change in ferroelectric characteristics was not observed or observed only to a small extent. A change in ferroelectric characteristics was not observed in the case where the amount of Nb added was zero, although the hysteresis was leaky. However, the hysteresis characteristics changed to a large extent in the case where the amount of Nb added was 20 mol % or more.

Figure 7:
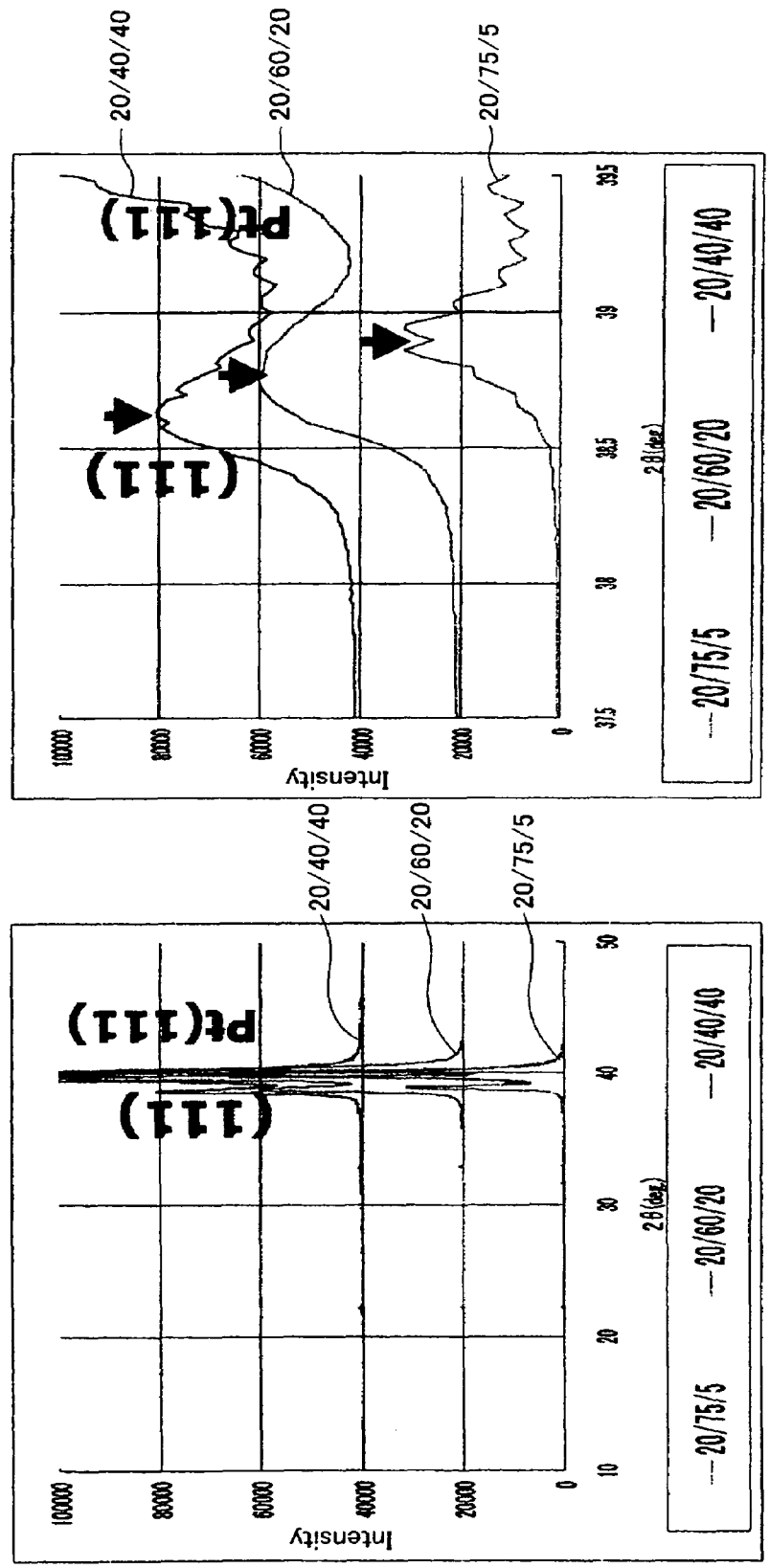
FIG. 7 are graphs for comparison of X-ray diffraction patterns when the amount of Nb added is 20 mol % or more.

FIG. 7 shows comparison results of X-ray diffraction patterns. In the case where the amount of Nb added was 5 mol %, the (111) peak position is the same as that in the case where the amount of Nb added was zero. The (11) peak was shifted to the low angle side as the amount of Nb added was increased to 20 mol % and 40 mol %. Specifically, the actual crystal was rhombohedral although the composition of PZT was in the Ti-Rich tetragonal region. The ferroelectric characteristics changed as the crystal system changed. Therefore, it was found that the ferroelectric characteristics are changed to a large extent by replacing the B site ion, since the B site ion influences the ferroelectric characteristics to a large extent.

Figure 8:
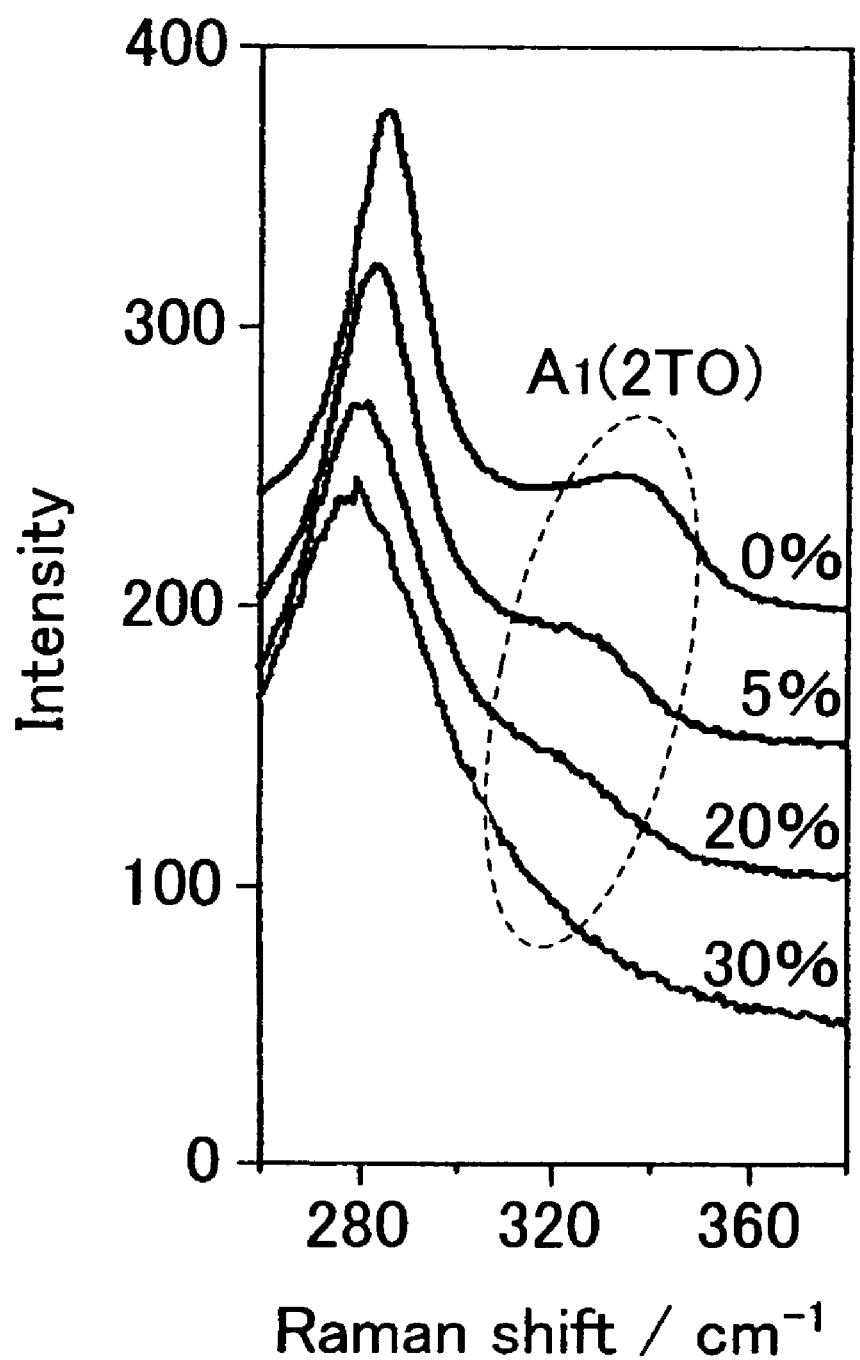
FIG. 8 is a graph showing Raman spectra of a PZTN film.

FIG. 8 shows Raman spectra of the PZTN film. As shown in FIG. 8, a large change was observed in the vibrational mode A1 (2TO) of the B site ion as the amount of Nb added was increased. Taking the results in FIGS. 4A and 4B into consideration, it was confirmed that Si replaces the A site and has a function of causing Nb to be dissolved in the B site at low temperature.

In the case where Nb was added in an amount of 45 mol %, ferroelectric characteristics could not be confirmed due to the absence of hysteresis. However, it was found that the resulting film can be used as a high dielectric film due to a high dielectric constant.

Figure 9:
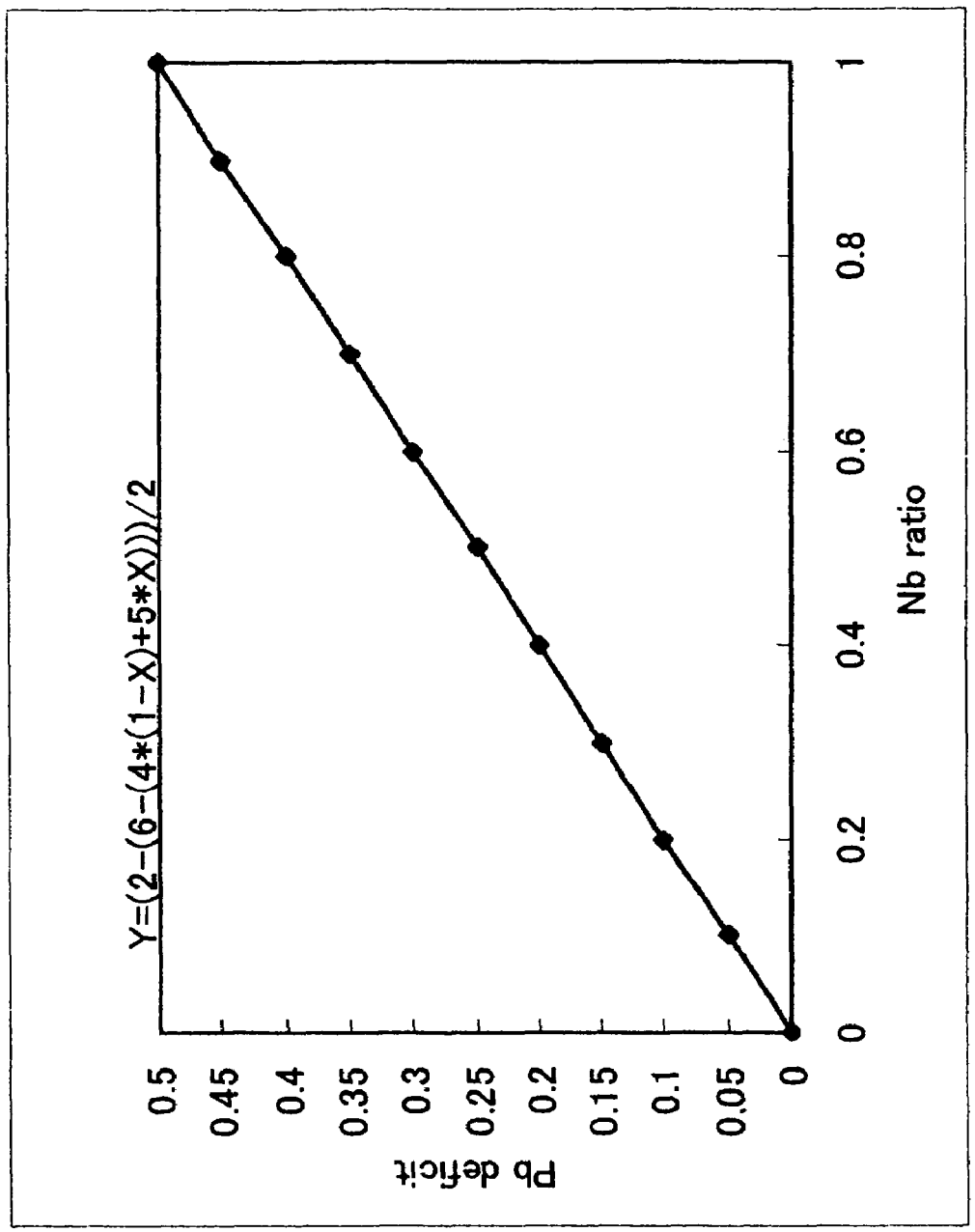
FIG. 9 is a graph showing conditions for PZTN to be an insulator.

The PZTN film of the present embodiment has very high insulating properties as described above. FIG. 9 shows conditions necessary for PZTN to be an insulator.

Figure 10:
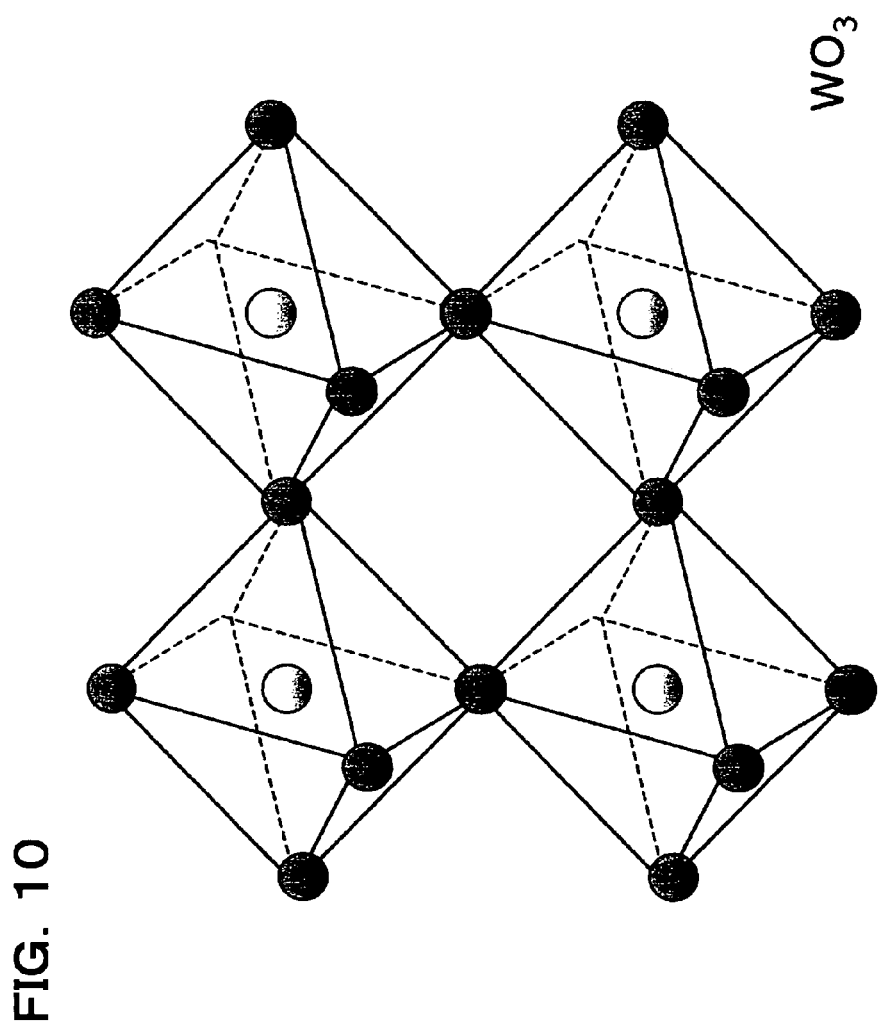
FIG. 10 is a diagram showing a crystal structure of $WO_3$.

Specifically, the PZTN film of the present embodiment has very high insulating properties, and Nb is added in half the amount of Pb vacancy. As is clear from $WO_3$ shown in FIG. 10, the perovskite crystal can be formed even if the A site ion is deficient at a percentage of 100%. It is known that the crystal system of $WO_3$ easily changes. Therefore, the amount of Pb vacancy in PZTN is positively controlled and the crystal system is also controlled by adding Nb.

The same effect as described above can be obtained by adding Ta, W, V, or Mo to the PZTN film of the present embodiment as an additive substance instead of Nb. The effect similar to that of Nb can be obtained by using Mn as an additive substance. From the same viewpoint, Pb may be replaced by an element with a valence of +3 or more in order to prevent Pb from being absent. As examples of such elements, lanthanoid series elements such as La, Ce, Pr, Nd, Pm, Sm, Eu, Gd, Tb, Dy, Ho, Er, Tm, Yb and Lu can be given. As an additive for promoting crystallization, a germanate may be used instead of a silicate.

This suggests that the PZTN film of the present embodiment is very effective in piezoelectric applications. In the case of using PZT in piezoelectric applications, a Zr-rich rhombohedral region is generally used. Zr-rich PZT is called soft PZT. This means that the crystal of the soft PZT is soft. The soft PZT is used as an ink-jet nozzle of an ink-jet printer. However, since the soft PZT is too soft, ink having high viscosity cannot be jetted since the pressure of the ink is too high.

Ti-rich tetragonal PZT is called hard PZT. This means that the hard PZT is hard and brittle. However, in the present invention, the crystal system of the hard PZT can be artificially changed to the rhombohedral system. Moreover, the crystal system can be arbitrarily changed by the amount of Nb added. Furthermore, since Ti-rich PZT has a small relative dielectric constant, the hard PZT can be driven at low voltage.

This enables the hard PZT to be used as an ink-jet nozzle of an ink-jet printer, for which the hard PZT has not been used. Moreover, since Nb provides PZT with softness, PZT which is moderately hard but is not brittle can be provided.

As described above, the present embodiment is not realized merely by the addition of Nb. The present embodiment is realized by adding a silicate in addition to Nb. This also enables the crystallization temperature to be reduced.

$PbSiO_3$ silicate was added to the PZTN film formed in the present embodiment, in which the amount of Nb added was 40 mol %, in an amount of 5, 10, and 15 mol %. In the PZTN film in which the amount of Nb was 40 mol %, PZT, which should be a tetragonal system, changed to a rhombohedral system.

Figure 11:
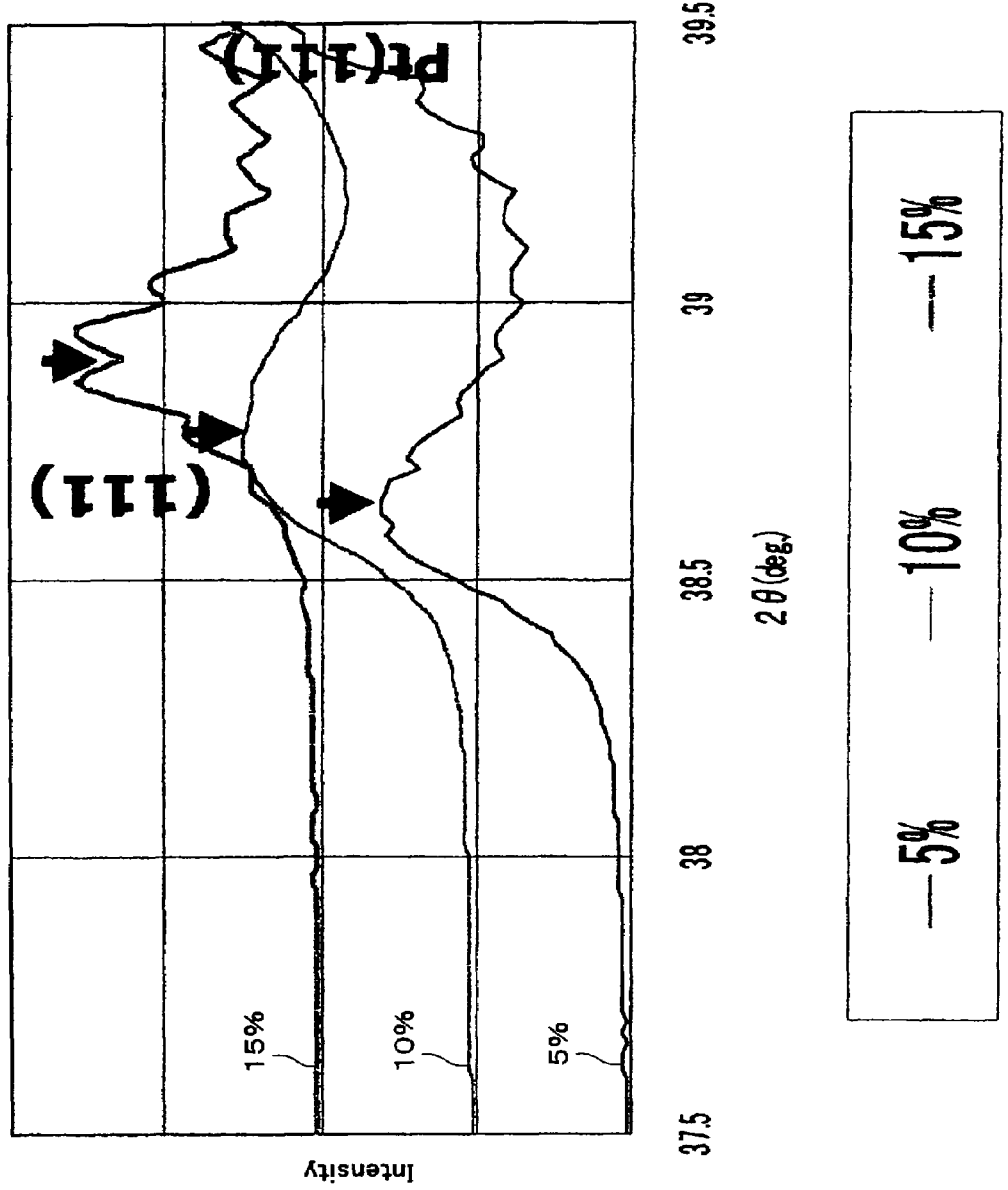
FIG. 11 shows XRD patterns when the amount of Si added to the A site is changed to 5, 10, and 15 mol %.

FIG. 11 shows XRD patterns when the amount of Si added to the A site is changed to 5, 10, and 15 mol %. As shown in FIG. 11, PZT returned to the original tetragonal system from the rhombohedral system as the amount of Si added was increased. Specifically, since Si is small, Si can easily enter the A site. The A site has 12 bonds. Si has a coordination number of four and has four bonds. The perovskite is formed as a crystal even if the A site is absent as described above. Therefore, it is easy to cause Si to bond to four of the 12 bonds.

Si which had entered the A site prevented inclination of the position of the oxygen octahedron which is the source of ferroelectricity, whereby the crystal system returned to the original tetragonal system from the rhombohedral system.

In the case where Si was added in an amount of 15% or more, the film became a high dielectric having no hysteresis while maintaining a relative dielectric constant of 600. The relative dielectric constant should be decreased unless Si becomes a part of the constituent elements of the crystal structure. The relative dielectric constant is decreased together with the remanent polarization, even if Si becomes the B site ion. In the case where Si becomes the A site ion, it is difficult for the oxygen octahedron to move due to strong covalent bonding properties of Si, although the A site ion originally has strong ionic bonding properties. As a result, the film became a high dielectric.

As described above, leakage characteristics can be improved without causing remanent polarization of conventional ferroelectrics to be changed by replacing the A site ion of the perovskite or pseudo-perovskite crystal by Si or Ge. Moreover, the film can be used as a high dielectric by eliminating only the remanent polarization while maintaining the relative dielectric constant. Therefore, functional design of ferroelectrics can be easily achieved by using the ferroelectric film of the present embodiment.

3. First Ferroelectric Memory

A ferroelectric memory including a capacitor which includes the ferroelectric film according to the embodiment of the present invention is described below in detail.

Figure 12:
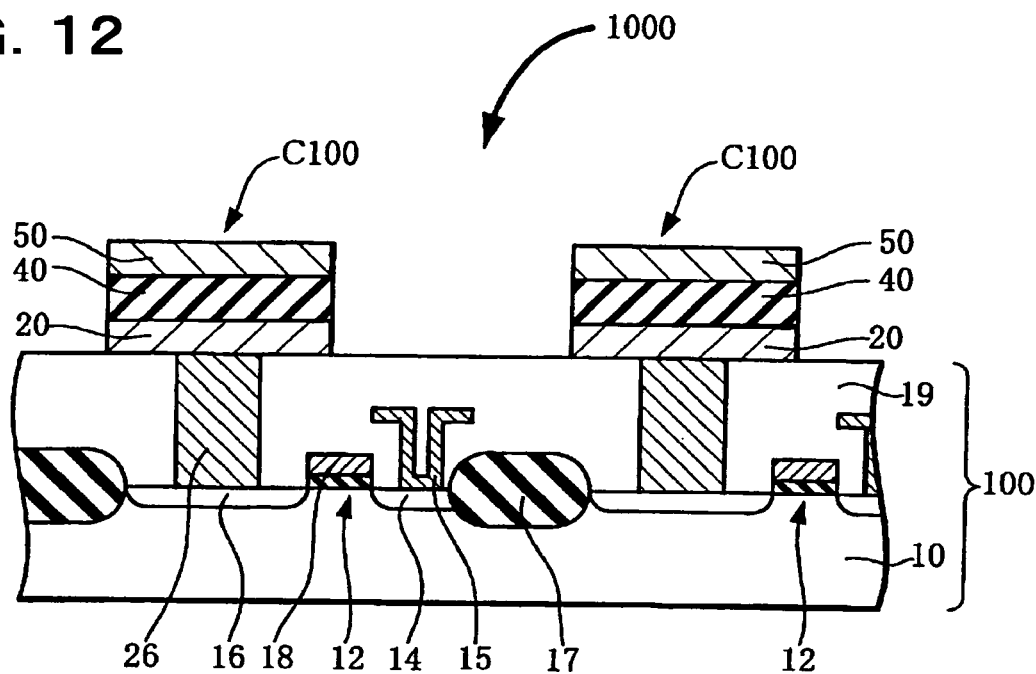
FIG. 12 shows a ferroelectric memory according to one embodiment of the present invention.

FIG. 12 is a cross-sectional view schematically showing a first ferroelectric memory 1000. The first ferroelectric memory 1000 includes a transistor formation region for controlling the ferroelectric memory. The transistor formation region corresponds to a substrate 100.

The substrate 100 includes a transistor 12 formed on a semiconductor substrate 10. A conventional configuration may be applied to the transistor 12. A film transistor (TFT) or MOSFET may be used as the transistor 12. In the example shown in FIG. 12, a MOSFET is used as the transistor 12, and the transistor 12 includes drain/sources 14 and 16 and a gate electrode 18.

An electrode 15 is formed on the drain/source 14, and a plug electrode 26 is formed on the drain/source 16. The plug electrode 26 is connected with a first electrode 20 of a ferroelectric capacitor C100 through a barrier layer, if necessary. The memory cells are separated by an element isolation region 17 such as LOCOS or trench isolation. An interlayer dielectric 19 is formed of an insulator such as silicon oxide on the semiconductor substrate 10 on which the transistor 12 and the like are formed.

In the above-described configuration, the structure under the ferroelectric capacitor C100 forms the transistor formation region which is the substrate 100. In more detail, the transistor formation region is formed of a structure including the transistor 12, the electrodes 15 and 26, and the interlayer dielectric 19 formed on the semiconductor substrate 10. The ferroelectric capacitor C100 manufactured by using the manufacturing method of the present embodiment is formed on the substrate 100.

The ferroelectric memory 1000 has a structure of storing charge as data in a storage capacitor in the same manner as the DRAM cell. Specifically, the memory cell includes the transistor and the ferroelectric capacitor, as shown in FIGS. 13 and 14.

Figure 13:
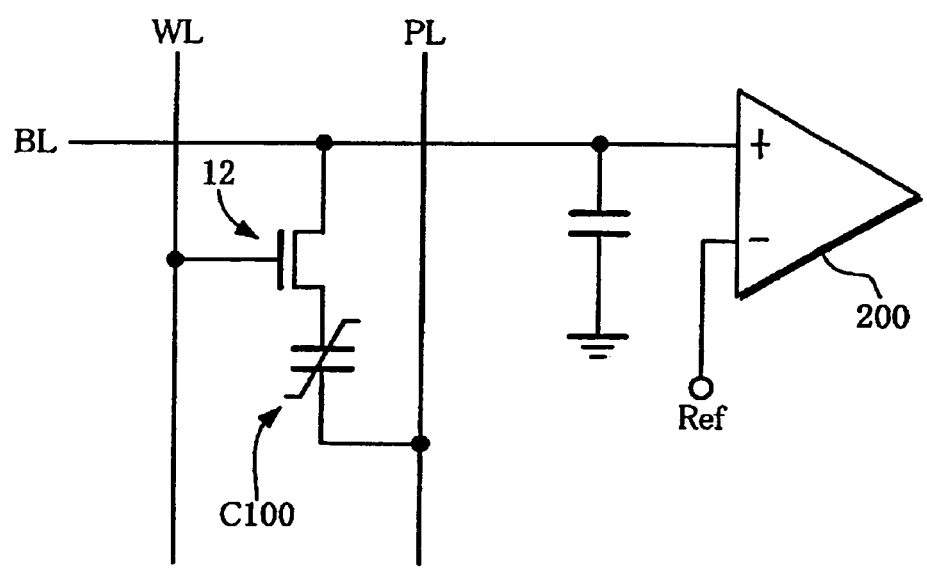
FIG. 13 shows a ferroelectric memory according to one embodiment of the present invention.
Figure 14:
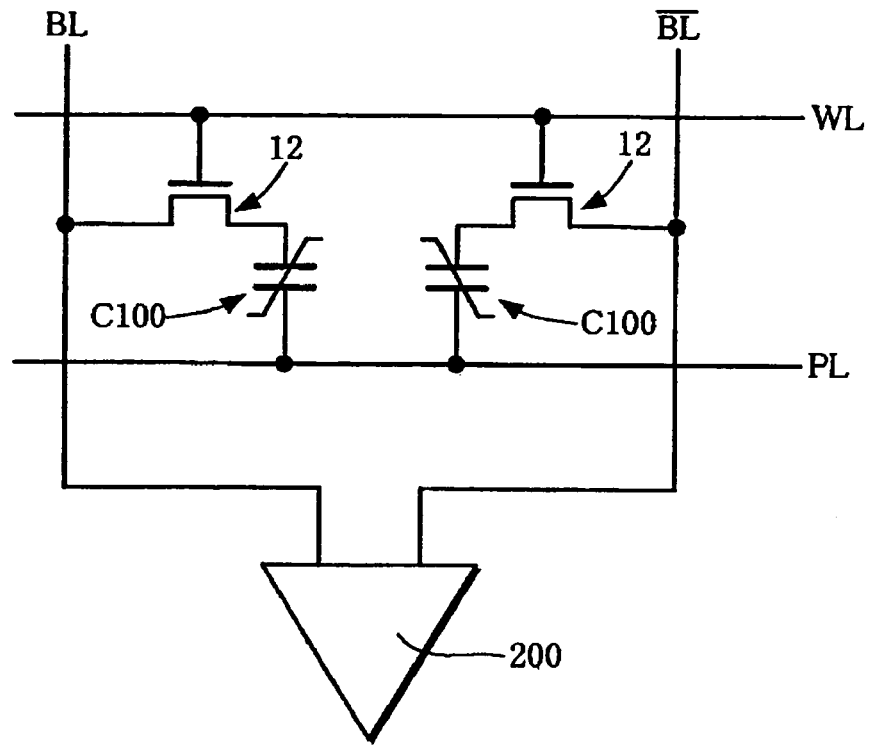
FIG. 14 shows a ferroelectric memory according to one embodiment of the present invention.

FIG. 13 shows a 1T1C cell type ferroelectric memory in which the memory cell includes one transistor 12 and one ferroelectric capacitor C100. The memory cell is located at an intersecting point of a wordline WL and a bitline BL. One end of the ferroelectric capacitor C100 is connected with the bitline BL through the transistor 12 which connects or disconnects the ferroelectric capacitor C100 and the bitline BL. The other end of the ferroelectric capacitor C100 is connected with a plate line PL. A gate of the transistor 12 is connected with the wordline WL. The bitline BL is connected with a sense amplifier 200 which amplifies a signal charge.

An example of the operation of the 1T1C cell is described below briefly.

In the read operation, the bitline BL is set at 0 V, and the transistor 12 is turned ON by applying voltage to the wordline WL. The amount of polarization charge corresponding to data stored in the ferroelectric capacitor C100 is transmitted to the bitline BL by increasing voltage applied to the plate line PL from 0 V to about a power supply voltage $V_{CC}$. The stored data can be read as $V_{CC}$ or 0 V by amplifying a small potential change generated by the amount of polarization charge by using the differential sense amplifier 200.

In the write operation, the transistor 12 is turned ON by applying voltage to the wordline WL, and the polarization state of the ferroelectric capacitor C100 is changed by applying voltage between the bitline BL and the plate line PL.

FIG. 14 shows a 2T2C cell type ferroelectric memory in which the memory cell includes two transistors 12 and two ferroelectric capacitors C100. The 2T2C cell has a structure of retaining complementary data by combining two 1T1C cells described above. Specifically, in the 2T2C cell, data is detected by inputting complementary signals to the sense amplifier 200 from two memory cells, in which data has been complementarily written, as two differential inputs. Therefore, since the data is written in two ferroelectric capacitors. C100 in the 2T2C cell the same number of times, the deterioration state of the ferroelectric films of the ferroelectric capacitors C100 becomes equal, whereby a stable operation can be achieved.

2. Second Ferroelectric Memory

Figure 15:
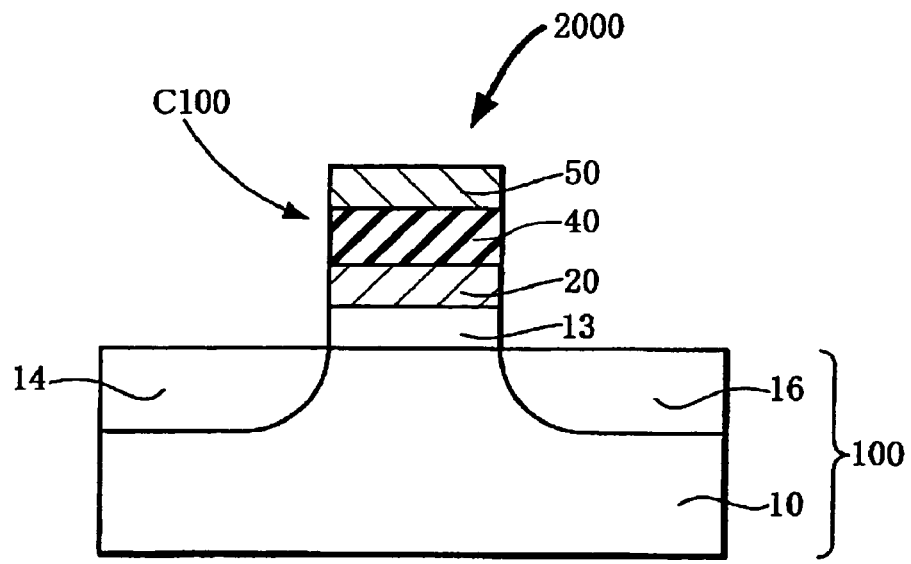
FIG. 15 shows a ferroelectric memory according to one embodiment of the present invention.
Figure 16:
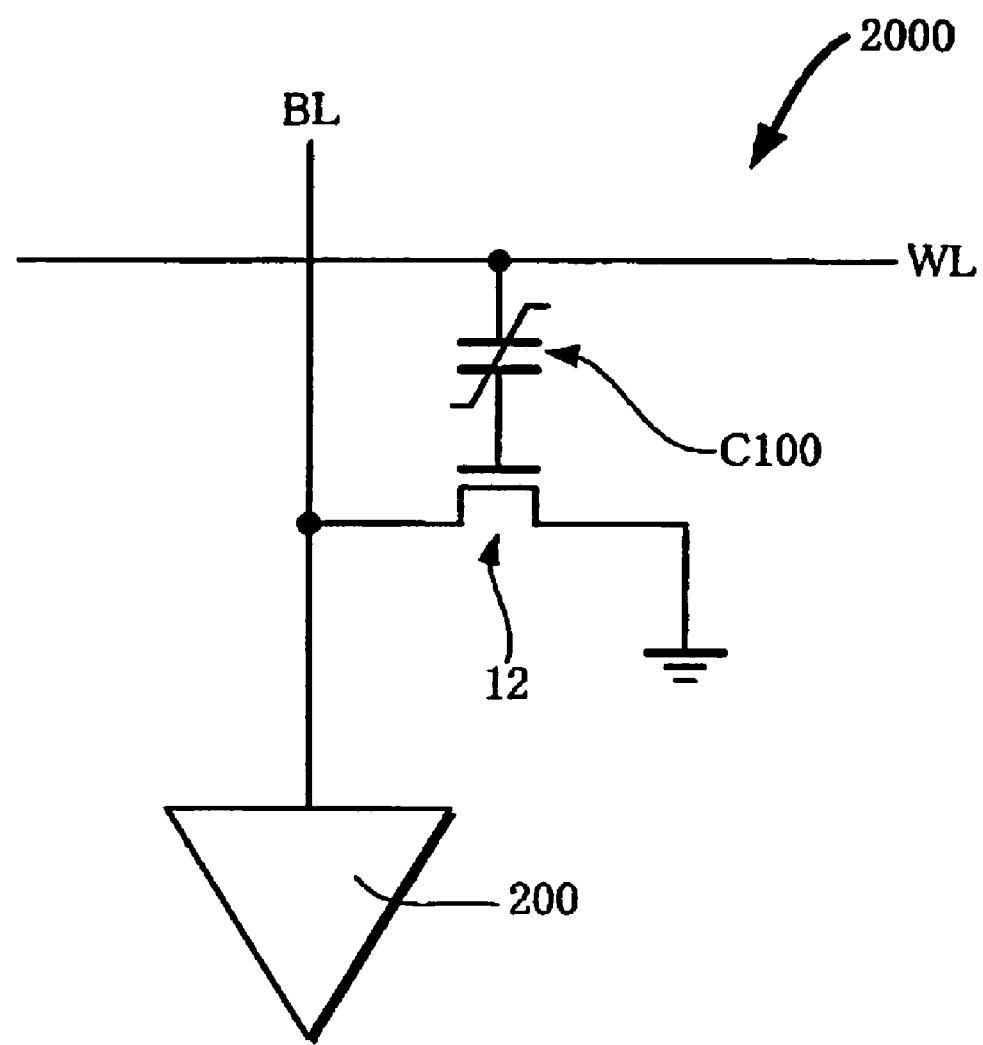
FIG. 16 shows a ferroelectric memory according to one embodiment of the present invention.

FIGS. 15 and 16 show a ferroelectric memory 2000 including MIS transistor type memory cells. The ferroelectric memory 2000 has a structure in which the ferroelectric capacitor C100 is directly connected to a gate insulating layer 13. In more detail, the source/drains 14 and 16 are formed in the semiconductor substrate 10, and the ferroelectric capacitor C100, in which the floating gate electrode (first electrode) 20, the ferroelectric film 40 according to the present invention, and the gate electrode (second electrode) 50 are stacked, is connected to the gate insulating layer 13. As the ferroelectric film 40, a ferroelectric film formed by applying the manufacturing method of the above embodiment is used. In the ferroelectric memory 2000, the semiconductor substrate 10, the source/drains 14 and 16, and the gate insulating layer 13 correspond to the substrate 100.

In the ferroelectric memory 2000, the wordline WL is connected with the gate electrode 50 of each cell, and the drain is connected with the bitline BL, as shown in FIG. 16. In this ferroelectric memory, the data write operation is performed by applying an electric field between the wordline WL and the well (source) of the selected cell. The read operation is performed by selecting the wordline WL corresponding to the selected cell, and detecting the amount of current flowing through the transistor using the sense amplifier 200 connected with the bitline BL of the selected cell.

5. Third Ferroelectric Memory

Figure 17:
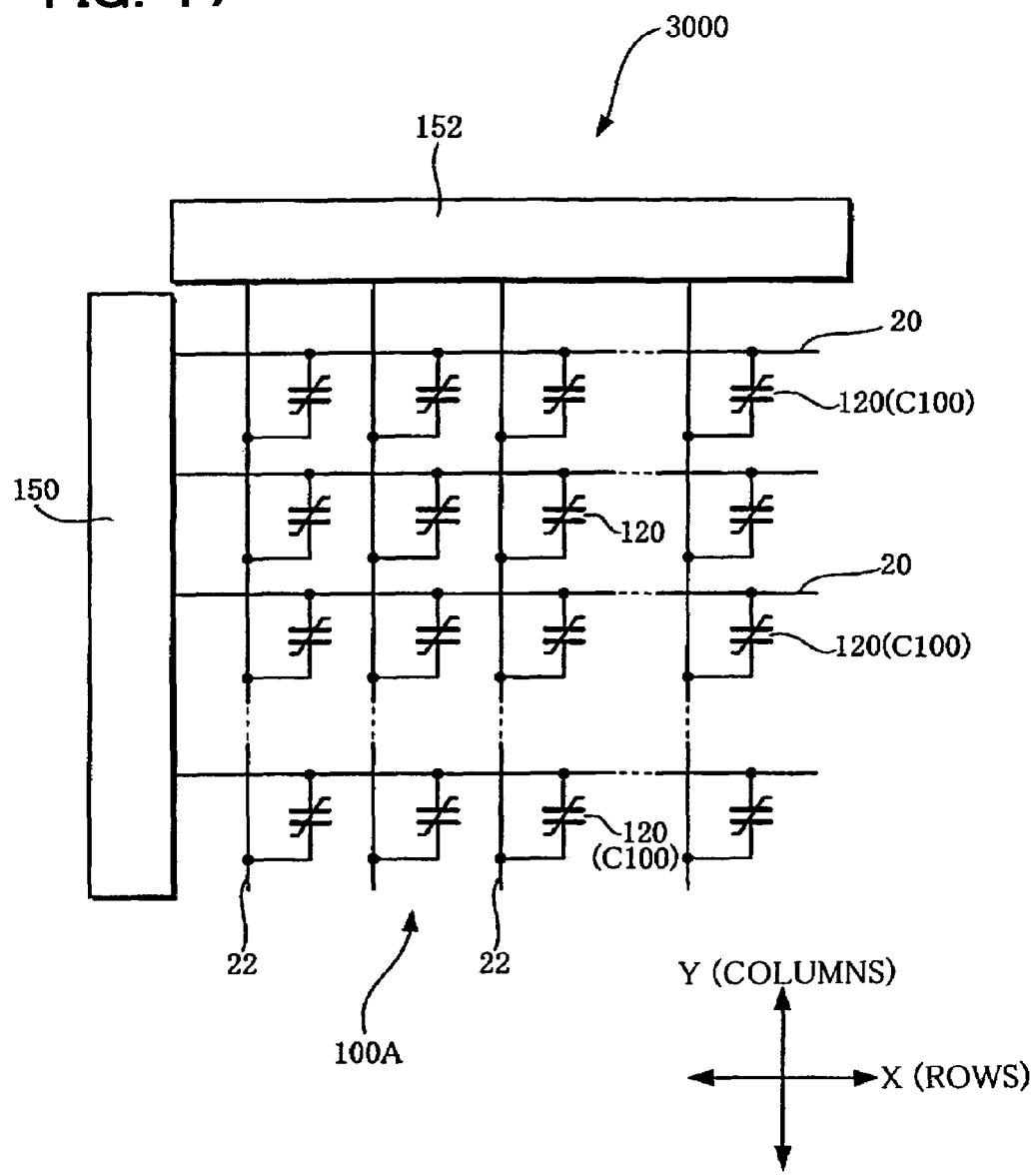
FIG. 17 shows a ferroelectric memory according to one embodiment of the present invention.
Figure 18:
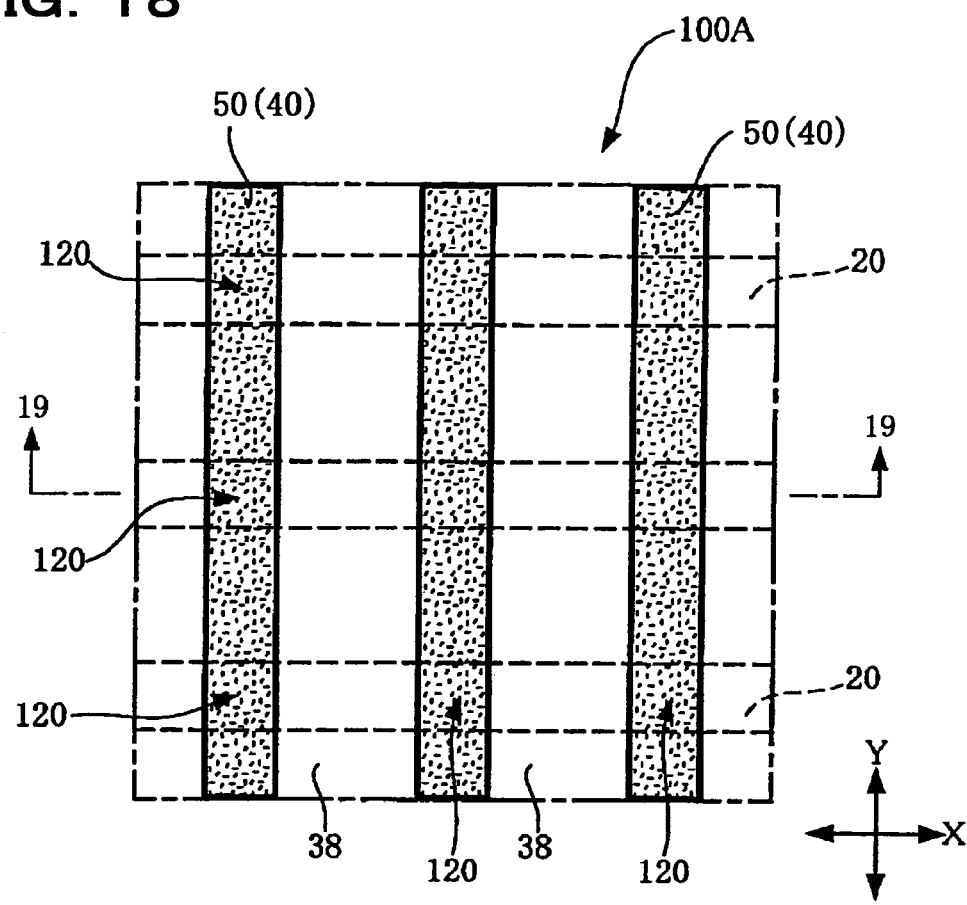
FIG. 18 shows a ferroelectric memory according to one embodiment of the present invention.
Figure 19:
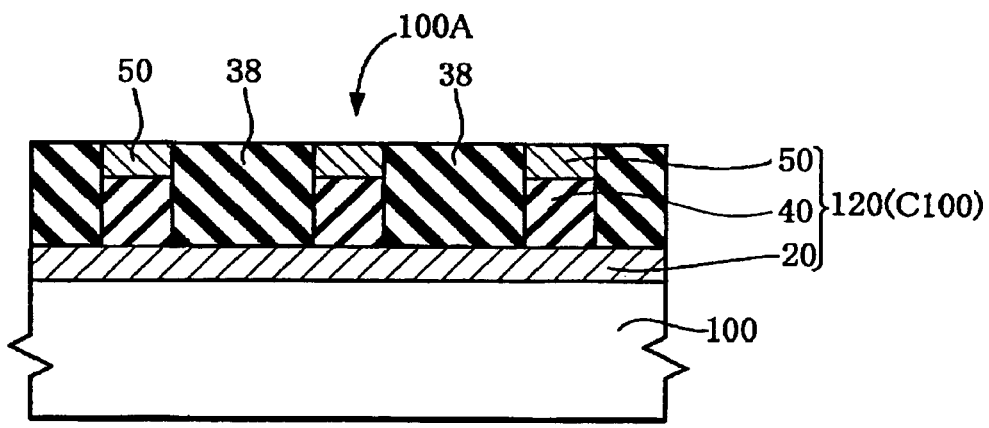
FIG. 19 shows a ferroelectric memory according to one embodiment of the present invention.

FIG. 17 schematically shows a third ferroelectric memory. FIG. 18 is an enlarged plan view showing a part of a memory cell array. FIG. 19 is a cross-sectional view taken along the line 19-19 of FIG. 18. In the plan view, numbers in parentheses indicate layers under the uppermost layer.

As shown in FIG. 17, a ferroelectric memory device 3000 in this example includes a memory cell array 100A in which memory cells 120 are arranged in the shape of a simple matrix, and various circuits for selectively writing or reading data in or from the memory cell 120 (ferroelectric capacitor C100), such as a first driver circuit 150 for selectively controlling the first signal electrode (first electrode) 20, a second driver circuit 152 for selectively controlling the second signal electrode (second electrode) 50, and a signal detection circuit such as a sense amplifier (not shown).

In the memory cell array 100A, the first signal electrodes (wordlines) 20 for selecting the row and the second signal electrodes (bitlines) 50 for selecting the column are arranged to intersect at right angles. Specifically, the first signal electrodes 20 are arranged at a specific pitch along the X direction. The second signal electrodes 50 are arranged at a specific pitch along the Y direction which intersects the X direction at right angles. The configuration of the signal electrodes may be the reverse of the above-described configuration. The first signal electrode may be the bitline and the second signal electrode may be the wordline.

In the memory cell array 100A according to the present embodiment, the first signal electrode 20, the ferroelectric film 40 according to the present invention, and the second signal electrode 50 are stacked on the insulating substrate 100, as shown in FIGS. 18 and 19. The first signal electrode 20, the ferroelectric layer 30 formed by applying the manufacturing method of the present embodiment, and the second signal electrode 50 make up the ferroelectric capacitor 120. Specifically, a memory cell including the ferroelectric capacitor 120 is formed in the intersecting region of the first signal electrode 20 and the second signal electrode 50.

A dielectric layer 38 is formed between laminates consisting of the ferroelectric film 40 and the second signal electrode 50 so as to cover exposed surfaces of the substrate 100 and the first signal electrode 20. The dielectric layer 38 preferably has a dielectric constant lower than the dielectric constant of the ferroelectric film 40. The floating capacitance of the first and second signal electrodes 20 and 50 can be reduced by allowing the dielectric layer 38 having a dielectric constant lower than that of the ferroelectric film 40 to be formed between the laminates consisting of the ferroelectric film 40 and the second signal electrode 50. As a result, the read and write operations of the ferroelectric memory 3000 can be performed at a higher speed.

An example of the read and write operations of the ferroelectric memory 3000 is described below.

In the read operation, a read voltage $V_0$ is applied to the capacitor in the selected cell. This also serves as a write operation of "0". At this time, current flowing through the selected bitline or a potential when causing the bitline to be in a high impedance state is read by using the sense amplifier. A given voltage is applied to the capacitors in the unselected cells in order to prevent occurrence of crosstalk during reading.

In the write operation of "1", a voltage $-V_0$ is applied to the capacitor in the selected cell. In the case of writing "0", a voltage which does not cause polarization reversal of the selected cell is applied to the capacitor in the selected cell, thereby retaining the "0" state written during the read operation. A given voltage is applied to the capacitors in the unselected cells in order to prevent occurrence of crosstalk during writing.

The above-described ferroelectric memory includes a ferroelectric capacitor including a ferroelectric film having excellent hysteresis characteristics with high insulating properties. Therefore, the present embodiment can provide a highly reliable ferroelectric memory.

Examples of the storage capacitance type, MIS transistor type, and simple matrix type ferroelectric memories are described above. However, the ferroelectric memory of the present invention is not limited thereto. The ferroelectric memory of the present invention may be applied to other types of memory transistors.

6. Piezoelectric Device and Ink-jet Recording Head

A piezoelectric device and an ink-jet recording head in the embodiment of the present invention are described below in detail.

As an ink-jet recording head in which a part of a pressure generating chamber connected with a nozzle orifice from which an ink droplet is ejected is formed by using a diaphragm, and the ink droplet is ejected from the nozzle orifice by pressurizing the ink in the pressure generating chamber by deforming the diaphragm using a piezoelectric device, an ink-jet recording head using a longitudinal vibration mode piezoelectric actuator which expands and contracts in the axial direction of the piezoelectric device, and an ink-jet recording head using a flexural vibration mode piezoelectric actuator have been put into practical use.

As an ink-jet recording head using the flexural vibration mode actuator, an ink-jet recording head obtained by forming a uniform piezoelectric layer over the entire surface of the diaphragm by using a deposition technology, and cutting the piezoelectric layer into a shape corresponding to the pressure generating chamber by using a lithographic method so that the piezoelectric device is independently formed in units of the pressure generating chambers has been known.

Figure 20:
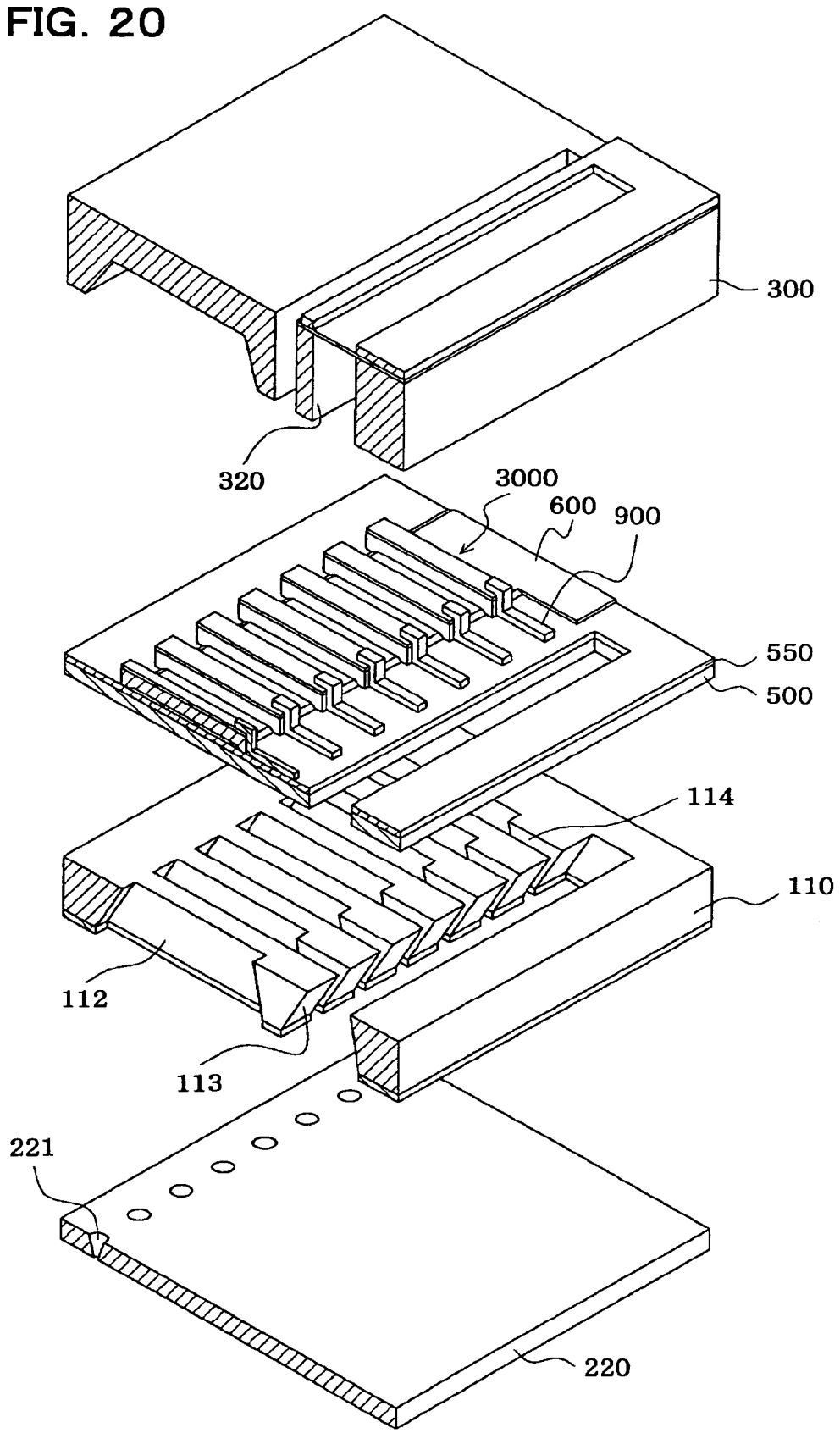
FIG. 20 is an exploded perspective view of a recording head according to one embodiment of the present invention.
Figure 21A:
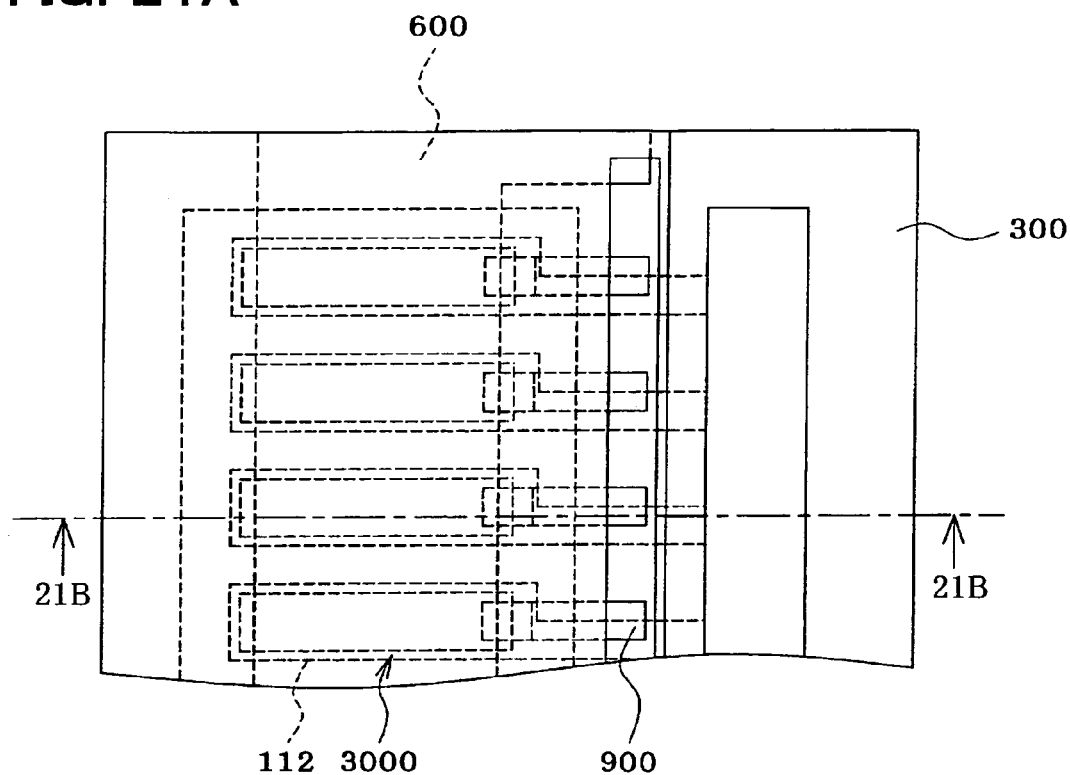
FIG. 21A is a plan view of a recording head according to one embodiment of the present invention.
Figure 21B:
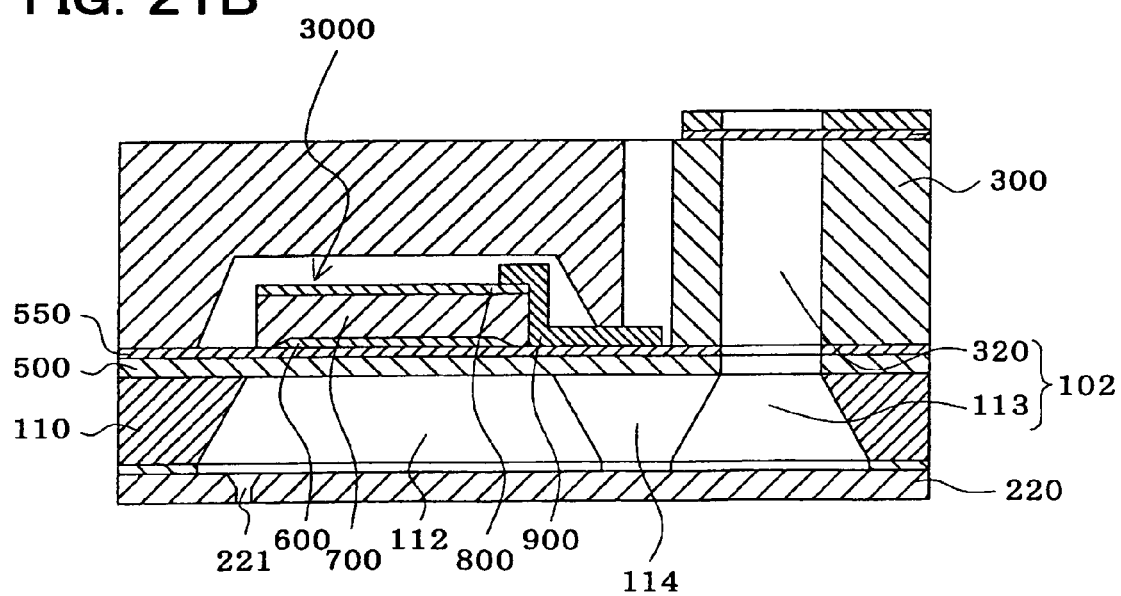
FIG. 21B is a cross-sectional view of a recording head according to one embodiment of the present invention.
Figure 22:
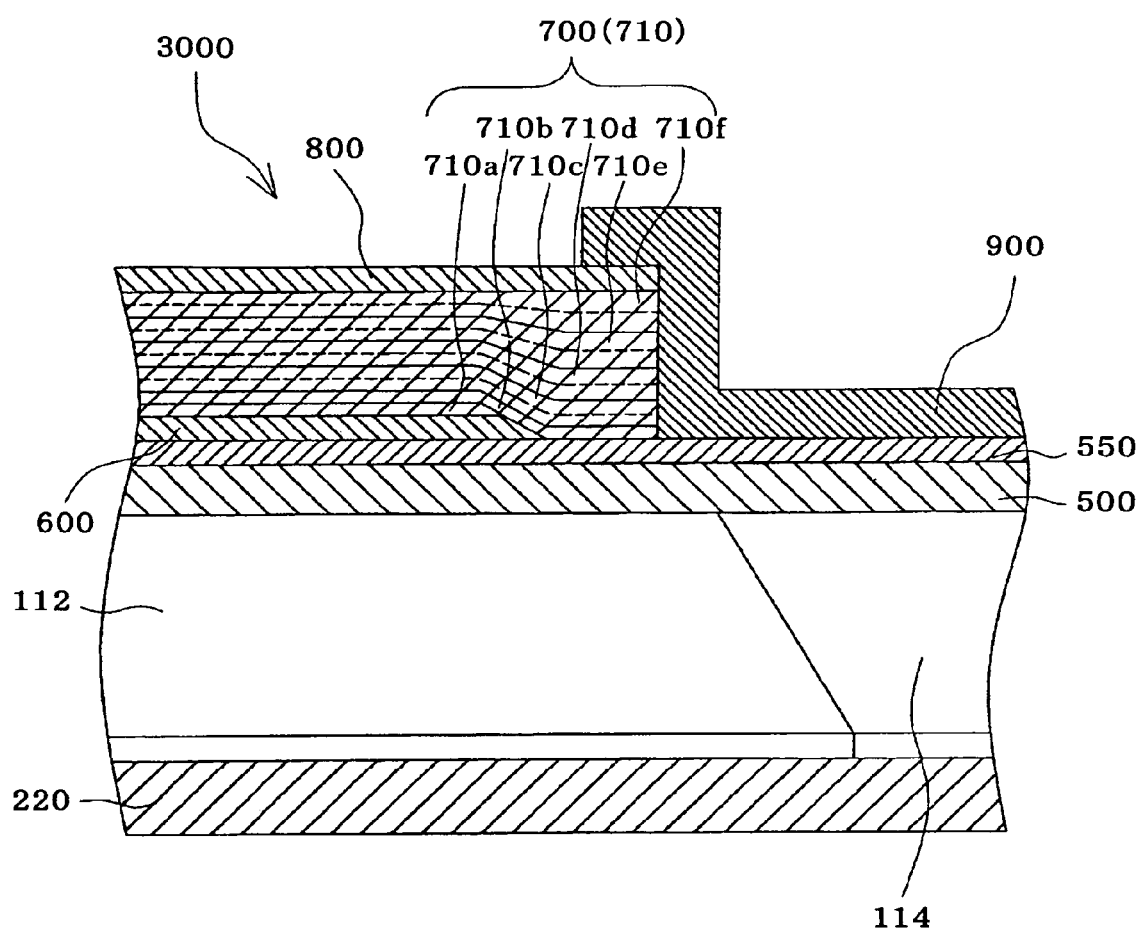
FIG. 22 is a schematic cross-sectional view showing a piezoelectric device according to one embodiment of the present invention.

FIG. 20 is an exploded perspective view schematically showing an ink-jet recording head according to one embodiment of the present invention. FIG. 21A is a plan view of FIG. 20. FIG. 21B is a cross-sectional view of FIG. 21A. FIG. 22 is a cross-sectional view showing a piezoelectric device 3000. As shown in the drawings, a channel forming substrate 110 is formed of a (100)-oriented silicon single crystal substrate, and an elastic film 50 with a thickness of 1 to 2 µm, which is made of silicon dioxide formed in advance by using thermal oxidation, is formed on one side of the channel forming substrate 10. A plurality of pressure generating chambers 112 are disposed in the channel forming substrate 110 in parallel in the widthwise direction. A communication section 113 is formed in the channel forming substrate 110 in the region outside the pressure generating chamber 112 in the longitudinal direction of the pressure generating chamber 112. The communication section 113 is connected with the pressure generating chambers 112 through ink supply paths 114 provided in units of the pressure generating chambers 112. The communication section 113 is connected with a reservoir section 320 of a sealing substrate 300 described later to make up a part of a reservoir 102 as a common ink chamber for the pressure generating chambers 112. The ink supply path 114 is formed to have a width smaller than the width of the pressure generating chamber 112, and maintains channel resistance of the ink, which flows into the pressure generating chamber 112 from the communication section 113, constant.

A nozzle plate 220, in which nozzle orifices 221 connected with the pressure generating chambers 112 near the edge opposite to the ink supply path 114 are formed, is secured to the channel forming substrate 110 on the opening side through an adhesive, a thermal-deposited film, or the like.

The elastic film 500 with a thickness of about 1.0 µm is formed on the channel forming substrate 110 on the side opposite to the opening side as described above. An insulator film 550 with a thickness of about 0.4 µm is formed on the elastic film 500. A lower electrode film 600 with a thickness of about 0.2 µm, a piezoelectric layer 700 with a thickness of about 1.0 µm, and an upper electrode film 800 with a thickness of about 0.05 µm are stacked on the insulator film 550 using a process described later to make up the piezoelectric device 3000. The piezoelectric device 3000 is the section including the lower electrode film 600, the piezoelectric layer 700, and the upper electrode film 800. Generally, one of the electrodes of the piezoelectric device 3000 is used as a common electrode, and the other electrode and the piezoelectric layer 700 are patterned in units of the pressure generating chambers 112. A section which is formed by the patterned electrode and piezoelectric layer 700 and in which a piezoelectric strain occurs by applying a voltage between the electrodes is called a piezoelectric active section. In the present embodiment, the lower electrode film 600 is used as the common electrode for the piezoelectric devices 3000, and the upper electrode film 800 is used as the individual electrodes for the piezoelectric devices 3000. However, the electrode configuration may be the reverse of the above electrode configuration depending on a driver circuit or interconnects. In either case, the piezoelectric active sections are formed in units of the pressure generating chambers. The piezoelectric device 3000 and the diaphragm which is displaced due to drive of the piezoelectric device 3000 are collectively called a piezoelectric actuator. The piezoelectric layers 700 are independently provided in units of the pressure generating chambers 112. As shown in FIG. 22, the piezoelectric layer 700 is made up of a plurality of ferroelectric film layers 710 (710a to 710f).

Figure 23:
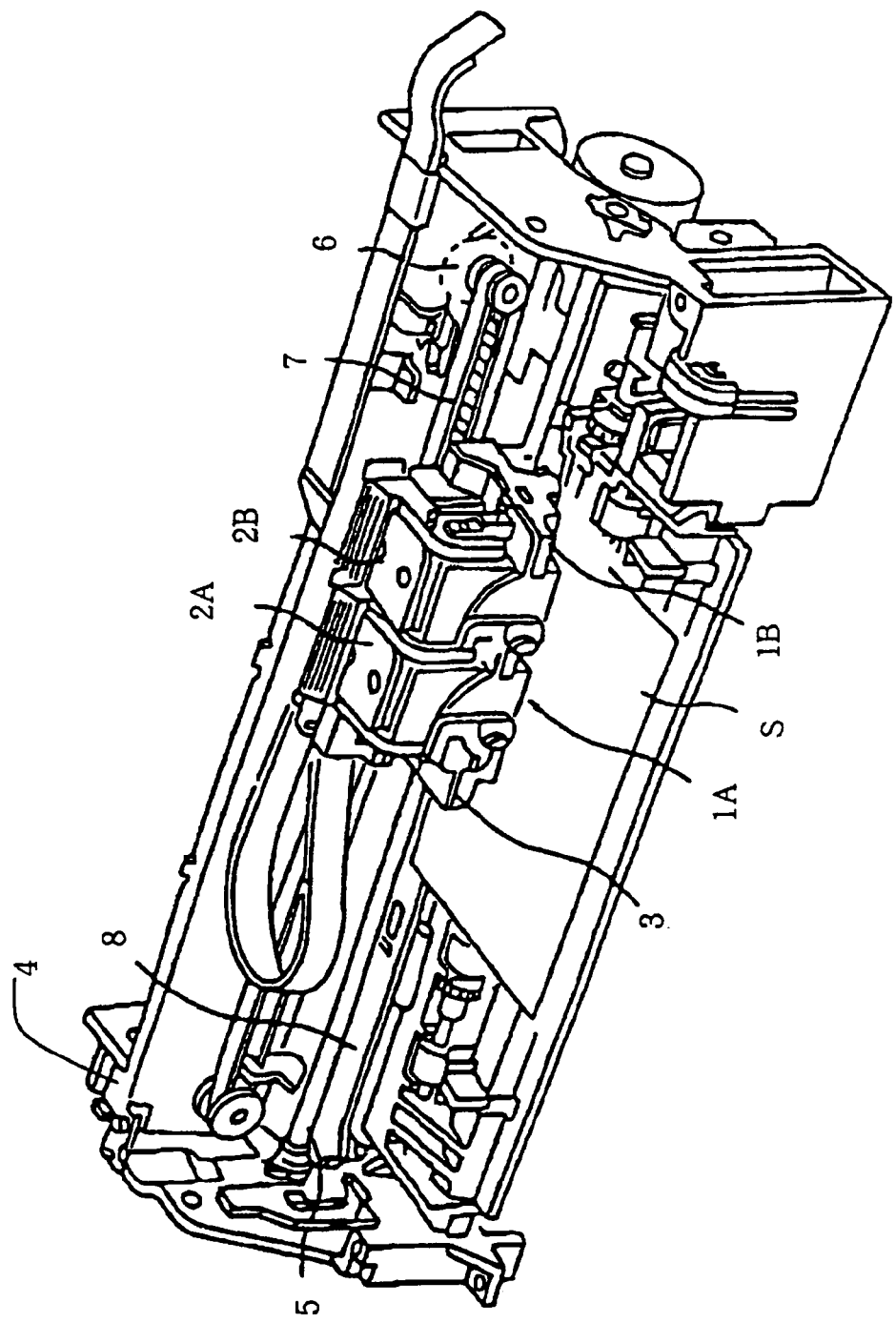
FIG. 23 schematically showing a recording device according to one embodiment of the present invention.

The ink-jet recording head makes up a part of a recording head unit including an ink channel which is connected with an ink cartridge or the like, and is provided in an ink-jet recording device. FIG. 23 schematically shows an example of the ink-jet recording device. As shown in FIG. 23, cartridges 2A and 2B which make up ink supply means are removably provided to recording head units 1A and 1B, each including the ink-jet recording head. A carriage 3 provided with the recording head units 1A and 1B is provided to a carriage shaft 5 attached to a device body 4 so as to be able to move freely in the axial direction. The recording head units 1A and 1B respectively eject a black ink composition and a color ink composition, for example. The driving force of a drive motor 6 is transferred to the carriage 3 through a plurality of gear wheels (not shown) and a timing belt 7, whereby the carriage 3 carrying the recording head units 1A and 1B is moved along the carriage shaft 5. A platen 8 is provided in the device body 4 along the carriage shaft 5. A recording sheet S as a recording medium such as paper fed by using a paper feed roller (not shown) or the like is transferred onto the platen 8.

The above description illustrates the ink-jet recording head which ejects the ink as a liquid jet head as an example. However, the present invention aims at a liquid jet head using a piezoelectric device and a liquid jet device in general. As the liquid jet head, a recording head used for an image recording device such as a printer, a color material jet head used for manufacturing a color filter for a liquid crystal display or the like, an electrode material jet head used for forming an electrode of an organic EL display, a field emission display (FED), or the like, a bio-organic substance jet head used for manufacturing a bio-chip, and the like can be given.

Since the piezoelectric device of the present embodiment uses the PZTN film according to the above embodiment as the piezoelectric layer, the following effects are obtained.

(1) Since covalent bonding properties in the piezoelectric layer are increased, the piezoelectric constant can be increased.

(2) Since vacancies of PbO in the piezoelectric layer can be reduced, occurrence of a heterophase at the interface between the piezoelectric layer and the electrode is prevented, whereby an electric field is easily applied. Therefore, efficiency of the piezoelectric device can be increased.

(3) Since a current leakage from the piezoelectric layer is reduced, the thickness of the piezoelectric layer can be reduced.

Since the liquid jet head and the liquid jet device of the present embodiment utilize the piezoelectric device including the above piezoelectric layer, the following effect is obtained.

(4) Since fatigue deterioration of the piezoelectric layer can be reduced, a change in the amount of displacement of the piezoelectric layer over time can be reduced, whereby reliability can be improved.

Examples of a piezoelectric device and an ink-jet recording head are described above. The ferroelectric film of the present invention may also be applied to a pyroelectric sensor and a bimorph piezo actuator.

What is claimed is:

1. A ferroelectric film including a perovskite ferroelectric or a bismuth layer-structured ferroelectric shown by $ABO_3$ or $(Bi_2O_2)^{2+}(A_{m-1}B_mO_{3m+1})^{2-}$ (wherein A represents at least one ion selected from the group consisting of $Li^+$, $Na^+$, $K^+$, $Pb^{2+}$, $Ca^{2+}$, $Sr^{2+}$, $Ba^{2+}$, $Bi^{3+}$ and $La^{3+}$, B represents at least one ion selected from the group consisting of $Fe^{3+}$, $Ti^{4+}$, $Zr^{4+}$, $Nb^{5+}$, $Ta^{5+}$, $W^{6+}$ and $Mo^{6+}$, and m is a natural number), wherein at least four-fold coordinated $Si^{4+}$ or $Ge^{4+}$ is included in the A site ion.

2. A ferroelectric film including a perovskite ferroelectric or a bismuth layer-structured ferroelectric shown by $ABO_3$ or $(Bi_2O_2)(A_{m-1}B_mO_{3m+1})^{2-}$ (wherein A represents at least one ion selected from the group consisting of $Li^+$, $Na^+$, $K^+$, $Pb^{2+}$, $Ca^{2+}$, $Sr^{2+}$, $Ba^{2+}$, $Bi^{3+}$ and $La^{3+}$, B represents at least one ion selected from the group consisting of $Fe^{3+}$, $Ti^{4+}$, $Zr^{4+}$, $Nb^{5+}$, $Ta^{5+}$, $W^{6+}$ and $Mo^{6+}$, and m is a natural number), wherein at least four-fold coordinated $Si^{4+}$ or $Ge^{4+}$ is included in the A site ion; and wherein the ferroelectric film is a solid solution with a dielectric shown by $X_2SiO_5$, $X_4Si_3O_{12}$, $X_2GeO_5$ or $X_4Ge_3O_{12}$ (wherein X represents $Bi^{3+}$, $Fe^{3+}$, $Sc^{3+}$, $Y^{3+}$, $La^{3+}$, $Ce^{3+}$, $Pr^{3+}$, $Nd^{3+}$, $Pm^{3+}$, $Sm^{3+}$, $Eu^{3+}$, $Gd^{3+}$, $Tb^{3+}$, $Dy^{3+}$, $Ho^{3+}$, $Er^{3+}$, $Tm^{3+}$, $Yb^{3+}$ or $Lu^{3+}$).

3. A ferroelectric film including a perovskite ferroelectric or a bismuth layer-structured ferroelectric shown by $ABO_3$ or $(Bi_2O_2)^{2+}(A_{m-1}B_mO_{3m+1})^{2-}$ (wherein A represents at least one ion selected from the group consisting of $Li^+$, $Na^+$, $K^+$, $Pb^{2+}$, $Ca^{2+}$, $Sr^{2+}$, $Ba^{2+}$, $Bi^{3+}$ and $La^{3+}$, B represents at least one ion selected from the group consisting of $Fe^{3+}$, $Ti^{4+}$, $Zr^{4+}$, $Nb^{4+}$, $Ta^{5+}$, $W^{6+}$ and $Mo^{6+}$, and m is a natural number), wherein at least four-fold coordinated $Si^{4+}$ or $Ge^{4+}$ is included in the A site ion; and wherein the ferroelectric film includes at least one transition element in an amount of 5 to 40 mol % in total, the transition element having a maximum positive valence which is +1 or more greater than a valence of the A site ion of the $ABO_3$ or $(Bi_2O_2)^{2+}(A_{m-1}B_mO_{3m+1})^{2-}$.

4. A ferroelectric film including a perovskite ferroelectric or a bismuth layer-structured ferroelectric shown by $ABO_3$ or $(Bi_2O_2)^{2+}(A_{m-1}B_mO_{3m+1})^{2-}$ (wherein A represents at least one ion selected from the group consisting of $Li^+$, $Na^+$, $K^+$, $Pb^{2+}$, $Ca^{2+}$, $Sr^{2+}$, $Ba^{2+}$, $Bi^{3+}$ and $La^{3+}$, B represents at least one ion selected from the group consisting of $Fe^{3+}$, $Ti^{4+}$, $Zr^{4+}$, $Nb^{5+}$, $Ta^{5+}$, $W^{6+}$ and $Mo^{6+}$, and m is a natural number), wherein at least four-fold coordinated $Si^{4+}$ or $Ge^{4+}$ is included in the A site ion; and wherein the ferroelectric film includes at least one transition element in an amount of 5 to 40 mol % in total, the transition element having a maximum positive valence which is +1 or more greater than a valence of the B site ion of the $ABO_3$ or $(Bi_2O_2)^{2+}(A_{m-1}B_mO_{3m+1})^{2-}$.

5. A ferroelectric film including a perovskite ferroelectric or a bismuth layer-structured ferroelectric shown by $ABO_3$ or $(Bi_2O_2)^{2+}(A_{m-1}B_mO_{3m+1})^{2-}$ (wherein A represents at least one ion selected from the group consisting of $Li^+$, $Na^+$, $K^+$, $Pb^{2+}$, $Ca^{2+}$, $Sr^{2+}$, $Ba^{2+}$, $Bi^{3+}$ and $La^{3+}$, B represents at least one ion selected from the group consisting of $Fe^{3+}$, $Ti^{4+}$, $Zr^{4+}$, $Nb^{5+}$, $Ta^{5+}$, $W^{6+}$ and $Mo^{6+}$, and m is a natural number), wherein at least four-fold coordinated $Si^{4+}$ or $Ge^{4+}$ is included in the A site ion;

wherein the ferroelectric film includes at least one transition element having a maximum positive valence which is +1 or more greater than a valence of the B site ion of the $ABO_3$ or $(Bi_2O_2)^{2+}(A_{m-1}B_mO_{3m+1})^{2-}$;

wherein the ferroelectric film includes at least one transition element having a maximum positive valence which is +1 or more greater than a valence of the A site ion of the $ABO3$ or $(Bi_2O_2)^{2+}(A_{m-1}B_mO_{3m+1})^{2-}$; and wherein the transition elements are included in an amount of 5 to 40 mol % in the A and B sites in total.

6. A ferroelectric film including a perovskite ferroelectric or a bismuth layer-structured ferroelectric shown by $ABO_3$ or $(Bi_2O_2)^{2+}(A_{m-1}B_mO_{3m+1})^{2-}$ (wherein A represents at least one ion selected from the group consisting of $Li^+$, $Na^+$, $K^+$, $Pb^{2+}$, $Ca^{2+}$, $Sr^{2+}$, $Ba^{2+}$, $Bi^{3+}$ and $La^{3+}$, B represents at least one ion selected from the group consisting of $Fe^{3+}$, $Ti^{4+}$, $Zr^{4+}$, $Nb^{4+}$, $Ta^{5+}$, $W^{6+}$ and $Mo^{6+}$, and mis a natural number), wherein at least four-fold coordinated $Si^{4+}$ or $Ge^{4+}$ is included in the A site ion;

wherein the ferroelectric film is a solid solution with a dielectric shown by $X_2SiO_5$, $X_4Si_3O_{12}$, $X_2GeO_5$ or $X_4Ge_3O_{12}$ (wherein X represents $Bi^{3+}$, $Fe^{3+}$, $Sc^{3+}$, $Y^{3+}$, $La^{3+}$, $Ce^{3+}$, $Pr^{3+}$, $Nd^{3+}$, $Pm^{3+}$, $Sm^{3+}$, $Eu^{3+}$, $Gd^{3+}$, $Tb^{3+}$, $Dy^{3+}$, $Ho^{3+}$, $Er^{3+}$, $Tm^{3+}$, $Yb^{3+}$ or $Lu^{3+}$); and wherein the ferroelectric film includes at least one transition element in an amount of 5 to 40 mol % in total, the transition element having the-a maximum positive valence which is +1 or more greater than a valence of the A site ion of the $ABO_3$ or $(Bi_2O_2)^{2+}(A_{m-1}B_mO_{3m+1})^{2-}$.

7. A ferroelectric film including a perovskite ferroelectric or a bismuth layer-structured ferroelectric shown by $ABO_3$ or $(Bi_2O_2)^{2+}(A_{m-1}B_mO_{3m+1})^{2-}$ (wherein A represents at least one ion selected from the group consisting of $Li^+$, $Na^+$, $K^+$, $Pb^{2+}$, $Ca^{2+}$, $Sr^{2+}$, $Ba^{2+}$, $Bi^{3+}$ and $La^{3+}$, B represents at least one ion selected from the group consisting of $Fe^{3+}$, $Ti^{4+}$, $Zr^{4+}$, $Nb^{4+}$, $Ta^{5+}$, $W^{6+}$ and $Mo^{6+}$, and mis a natural number), wherein at least four-fold coordinated $Si^{4+}$ or $Ge^{4+}$ is included in the A site ion;

wherein the ferroelectric film is a solid solution with a dielectric shown by $X_2SiO_5$, $X_4Si_3O_{12}$, $X_2GeO_5$ or $X_4Ge_3O_{12}$ (wherein X represents $Bi^{3+}$, $Fe^{3+}$, $Sc^{3+}$, $Y^{3+}$, $La^{3+}$, $Ce^{3+}$, $Pr^{3+}$, $Nd^{3+}$, $Pm^{3+}$, $Sm^{3+}$, $Eu^{3+}$, $Gd^{3+}$, $Tb^{3+}$, $Dy^{3+}$, $Ho^{3+}$, $Er^{3+}$, $Tm^{3+}$, $Yb^{3+}$ or $Lu^{3+}$); and wherein the ferroelectric film includes at least one transition element in an amount of 5 to 40 mol % in total, the transition element having a maximum positive valence which is +1 or more greater than a valence of the B site ion of the $ABO_3$ or $(Bi_2O_2)^{2-}(A_{m-1}B_mO_{3m+1})^{2-}$.

8. A ferroelectric film including a perovskite ferroelectric or a bismuth layer-structured ferroelectric shown by $ABO_3$ or $(Bi_2O_2)^{2+}(A_{m-1}B_mO_{3m+1})^{2-}$ (wherein A represents at least one ion selected from the group consisting of $Li^+$, $Na^+$, $K^+$, $Pb^{2+}$, $Ca^{2+}$, $Sr^{2+}$, $Ba^{2+}$, $Bi^{3+}$ and $La^{3+}$, B represents at least one ion selected from the group consisting of $Fe^{3+}$, $Ti^{4+}$, $Zr^{4+}$, $Nb^{4+}$, $Ta^{5+}$, $W^{6+}$ and $Mo^{6+}$, and mis a natural number), wherein at least four-fold coordinated $Si^{4+}$ or $Ge^{4+}$ is included in the A site ion;

wherein the ferroelectric film is a solid solution with a dielectric shown by $X_2SiO_5$, $X_4Si_3O_{12}$, $X_2GeO_5$ or $X_4Ge_3O_{12}$ (wherein X represents $Bi^{3+}$, $Fe^{3+}$, $Sc^{3+}$, $Y^{3+}$, $La^{3+}$, $Ce^{3+}$, $Pr^{3+}$, $Nd^{3+}$, $Pm^{3+}$, $Sm^{3+}$, $Eu^{3+}$, $Gd^{3+}$, $Tb^{3+}$, $Dy^{3+}$, $Ho^{3+}$, $Er^{3+}$, $Tm^{3+}$, $Yb^{3+}$ or $Lu^{3+}$); and wherein the ferroelectric film includes at least one transition element in an amount of 5 to 40 mol % in total, the transition element having a maximum positive valence which is +1 or more greater than a valence of the B site ion of the $ABO_3$ or $(Bi_2O_2)^{2-}(A_{m-1}B_mO_{3m+1})^{2-}$;

wherein the ferroelectric film includes at least one transition element having a maximum positive valence which is +1 or more greater than a valence of the A site ion of the $ABO_3$ or $(Bi_2O_2)^{2-}(A_{m-1}B_mO_{3m+1})^{2-}$; and wherein the transition elements are included in an amount of 5 to 40 mol % in the A and B sites in total.

9. The ferroelectric film as defined in any of claims 1 to 8, wherein the ferroelectric film includes $Pb(Zr, Ti)O_3$ which includes at least four-fold coordinated $Si^{4+}$ or $Ge^{4+}$ in the A site ion in an amount of 1 mol % or more; and wherein at least one transition element having a maximum positive valence of +3 or more is included in the A site in an amount of 5 to 40 mol % in total.

10. The ferroelectric film as defined in any of claims 1 to 8, wherein the ferroelectric film includes $Pb(Zr, Ti)O_3$ which includes at least four-fold coordinated $Si^{4+}$ or $Ge^{4+}$ in the A site ion in an amount of 1 mol % or more; and wherein at least one transition element having a maximum positive valence of +5 or more is included in the B site in an amount of 5 to 40 mol % in total.

11. A ferroelectric film including $Pb(Zr, Ti)O_3$ which includes at least four-fold coordinated $Si^{4+}$ or $Ge^{4+}$ in a Pb site ion in an amount of 1 mol % or more, wherein at least one transition element having a maximum positive valence of +3 or more is included in the Pb site;

wherein at least one transition element having a maximum positive valence of +5 or more is included in a Zr or Ti site; and wherein the transition elements are included in an mount of 5 to 40 mol % in the Pb and Zr or Ti sites in total.

12. A ferroelectric film including $Pb(Zr, Ti)O_3$ which includes at least four-fold coordinated $Si^{4+}$ or $Ge^{4+}$ in a Pb site ion in an amount of 1 mol % or more, wherein at least one of La and other lanthanoid series ions is included in the Pb site in an amount of 5 to 40 mol % in total.

13. A ferro electric film including Pb(Zr, Ti)O$_3$ which includes at least four-fold coordinated Si$^{4+}$ or Ge$^{4+}$ in a Pb site ion in an amount of 1 mol % or more, wherein at least one of Nb, V and W is included in a Zr or Ti site in an amount of 5 to 40 mol % in total.

14. A ferroelectric film including Pb(Zr, Ti)O$_3$ which includes at least four-fold coordinated Si$^{4+}$ or Ge$^{4+}$ in a Pb site ion in an amount of 1 mol % or more, wherein at least one of La and other lanthanoid series ions is included in the Pb site, and at least one of Nb, V and W is included in a Zr or Ti site, in an amount of 5 to 40 mol % in the Pb and Zr or Ti sites in total.

15. The ferroelectric film as defined in any of claims 11 to 14, further including:

at least one of Nb, V and W in the Zr or Ti site in an amount twice the amount of a Pb ion vacancy in the Pb site.

16. The ferroelectric film as defined in any of claims 11 to 14 including (111)-oriented tetragonal crystals.

17. The ferroelectric film as defined in any of claims 11 to 14 including (001)-oriented rhombohedral crystals.

18. A ferroelectric memory comprising the ferroelectric film as defined in any of claims 1-8 and 11-14.

19. A piezoelectric device comprising the ferroelectric film as defined in any of claims 1-8 and 11-14.

* * * * *